United States Patent
Takahashi et al.

(10) Patent No.: US 7,813,096 B2
(45) Date of Patent: Oct. 12, 2010

(54) POWER SUPPLY CONTROLLER

(75) Inventors: Seiji Takahashi, Yokkaichi (JP);
Masayuki Kato, Yokkaichi (JP);
Masahiko Furuichi, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 331 days.

(21) Appl. No.: 12/086,640

(22) PCT Filed: Dec. 26, 2006

(86) PCT No.: PCT/JP2006/325947
§ 371 (c)(1),
(2), (4) Date: Jun. 17, 2008

(87) PCT Pub. No.: WO2007/074837
PCT Pub. Date: Jul. 5, 2007

(65) Prior Publication Data
US 2010/0134939 A1     Jun. 3, 2010

(51) Int. Cl.
*H02H 3/08* (2006.01)
*H02H 9/02* (2006.01)
*H02H 3/00* (2006.01)
*H02H 9/08* (2006.01)

(52) U.S. Cl. .................... 361/93.1; 361/87; 361/93.5; 361/93.7

(58) Field of Classification Search ............ None
See application file for complete search history.

(56) References Cited

U.S. PATENT DOCUMENTS

| | | | | |
|---|---|---|---|---|
| 6,407,537 | B2 * | 6/2002 | Antheunis | 323/312 |
| 7,079,368 | B2 * | 7/2006 | Ishikawa et al. | 361/93.1 |
| 7,224,155 | B2 * | 5/2007 | Bo et al. | 323/312 |
| 2002/0141126 | A1 * | 10/2002 | Tabata | 361/93.7 |
| 2003/0072120 | A1 | 4/2003 | Ishikawa et al. | |

FOREIGN PATENT DOCUMENTS

| | | |
|---|---|---|
| DE | 102 45 098 A1 | 4/2003 |
| JP | A 11-136846 | 5/1999 |
| JP | A 2001-217696 | 8/2001 |
| JP | A 2003-111264 | 4/2003 |

OTHER PUBLICATIONS

Japanese Office Action issued for Japanese Application No. 2007-522745 on Feb. 23, 2010 (with translation).
Office Action issued for German Patent Application No. 11 2006 003 482.0-31 issued Oct. 16, 2009.

* cited by examiner

*Primary Examiner*—Stephen W Jackson
*Assistant Examiner*—Dharti H Patel
(74) *Attorney, Agent, or Firm*—Oliff & Berridge, PLC

(57) ABSTRACT

A second forcing shutoff operation is performed for a power MOSFET 15 and the like, if a time when a load current (or a sense current Is) passing on a power supply line L exceeds a first threshold current Ia reaches a first reference time. On the other hand, the count value of a fuse time counter 71 is cleared to be "zero" so that the shutoff operation for the power MOSFET 15 and the like is not performed, if a normal state, in which neither an overcurrent nor a fuse current has occurred, continues for a second reference time without the first reference time being reached.

21 Claims, 24 Drawing Sheets

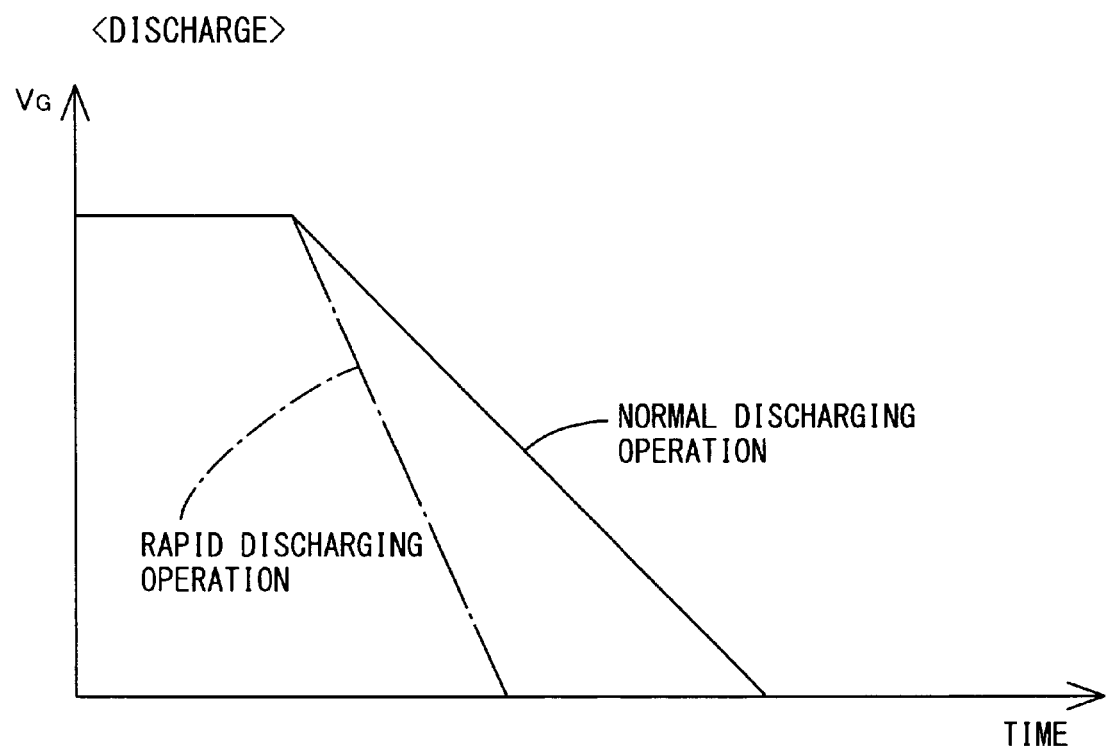

FIG.20

| FC COUNTER | FR COUNTER (higher 5 bits) | THRESHOLD DESIGNATION SIGNAL |
|---|---|---|
| [FCC]<8 | 0≤[FRC]<1 | OCL0 |
| | 1≤[FRC]<2 | OCL1 |
| | 2≤[FRC]<4 | OCL2 |
| | 4≤[FRC]<8 | OCL3 |
| | 8≤[FRC]<32 | OCL4 |
| | [FRC]≤32 | OCL5 |
| [FCC]≥8 | — | OCL5 |

POWER SUPPLY CONTROLLER

TECHNICAL FIELD

The present invention relates to a power supply controller, and particularly relates to an overcurrent protective technology for an external circuit (e.g., a load or an electric wire) connected to a semiconductor switching element.

BACKGROUND ART

A power supply controller is conventionally provided, in which a high-power semiconductor switching element such as a power MOSFET is disposed on a power supply line connected between a power source and a load, and which is configured to control the power supply to the load by switching the semiconductor switching element between ON and OFF. As shown in JP-A-2001-217696, some of such power supply controllers have a self-protective function. The self-protective function turns off the semiconductor switching element in response to an occurrence of overcurrent by controlling the potential of the control terminal of the semiconductor switching element so as to shut off the current supply, and thereby protects the semiconductor switching element. Specifically, a current detecting resistor is serially connected to a current conducting terminal (e.g., the source or drain in the case of a MOSFET) of the semiconductor switching element, for example. The voltage drop on the resistor is detected, and the occurrence of overcurrent is determined if the voltage drop is larger than a predetermined level.

However, even in the case that the power supply controller having a self-protective function described above is used, an external circuit (e.g., a wiring member (such as a wire)) may produce heat due to the power supply resulting in burnout, if the self-protective function performs forcing ON-OFF operations in succession so that the semiconductor switching element is intermittently turned to a conductive state or a shutoff state. For this reason, an additional fuse element is conventionally provided on the power supply line in consideration of the load resistance of the external circuit or the like.

Note that a wiring member typically has a construction in which a plurality of stranded wires are bundled together and covered with a coating, for example. The fuse value of the fuse element is determined in consideration of heat produced when an overcurrent passes through all the stranded wires. However, the construction utilizing a fuse element may fail to protect the wiring member. That is, a chattering short may occur, if a fraction of the stranded wires are exposed to the outside of the coating due to partial damage of the coating of the wiring member and thereby the fraction of the stranded wires intermittently forms a short circuit with a surrounding conductive member (e.g., a vehicle body) due to a vibration of the vehicle on which the power supply controller is installed, for example. When a chattering short of some duration occurs in some periods, the amount of an overcurrent passing into the fuse element will not reach an extent of fusing. However, an overcurrent may pass through the short-circuiting fraction of the stranded wires, and thereby heat may be locally produced so that the coating on the periphery thereof smokes. To cope with this, the fuse value of the fuse element can be determined based on the amount of an overcurrent passing through the above fraction of the stranded wires. However, this solution is not desirable, because the fuse element may fuse due to an inrush current, i.e., due to a high current occurring when power supply to the load starts, for example.

In some cases, an FET having an overheat protective function is used as a semiconductor switching element. The FET having an overheat protective function includes a temperature sensor for detecting the temperature of the FET, and turns the FET to a shutoff state if the temperature rises to a predetermined temperature due to an overcurrent passing between the drain and source when short-circuiting occurs in an external circuit, for example. In the case that such an FET having an overheat protective function is used, the above predetermined temperature is also based on an overcurrent passing through all the stranded wired of the wiring member, and therefore the problem arises that a wiring member cannot be protected in some cases similarly to the above-described construction using a fuse element.

Thus, there is a need in the art to protect an external circuit even when an intermittent overcurrent such as a chattering short occurs.

SUMMARY OF THE INVENTION

A power supply controller according to the present invention is provided for controlling power supply from a power source to a load. The power supply controller includes a semiconductor switching element disposed on a power supply line from the power source to the load; a current detecting element configured to detect a load current passing through the semiconductor switching element; and a first abnormal current detecting circuit configured to determine based on a detection signal from the current detecting element whether a load current passing through the semiconductor switching element exceeds a first threshold, and further configured to output a first abnormal current signal if the load current exceeds the first threshold. Further included are an anomaly time accumulator circuit configured to start accumulation of an anomaly time if the first abnormal current detecting circuit outputs the first abnormal current signal, and further configured to initiate a first shutoff operation for the semiconductor switching element when the anomaly time reaches a first reference time; a normal duration accumulator circuit configured to output a clear signal when a normal duration, during which the load current is continuously maintained lower than the first threshold, reaches a second reference time after the anomaly time accumulator circuit starts the accumulation; and an anomaly time clear circuit configured to clear the anomaly time of the anomaly time accumulator circuit based on an output of the clear signal.

According to the present invention, accumulation of an anomaly time is started when the load current passing on the power supply line exceeds the first threshold (i.e., when a first current anomaly occurs), and a shutoff operation for the semiconductor switching element is initiated when the anomaly time reaches the first reference time. On the other hand, if a normal state, in which the load current is equal to or less than a normal level lower than the first threshold, continues for a second reference time without the first reference time being reached, the anomaly time having been accumulated by the anomaly time accumulator circuit is cleared (i.e., the current accumulated time is changed to the initial time (completely cleared) or changed to a time closer to the initial time (partially cleared)) so that a shutoff operation for the semiconductor switching element is not performed. Thereby, as well as short-circuiting due to a continuous abnormal current, a chattering short, due to an intermittent abnormal current occurring at intervals shorter than the second reference time, can be detected for achieving protection of an external circuit or the like.

The above invention preferably includes a free-running counter circuit configured to repeat count of a predetermined time and output a count-up signal whenever each count of the predetermined time is completed. The anomaly time accumulator circuit includes a fuse counter circuit configured to increment its count whenever the free-running counter circuit outputs the count-up signal if the first abnormal current detecting circuit outputs the first abnormal current signal, and further configured to initiate the first shutoff operation for the semiconductor switching element when its count value reaches a reference anomaly count value. The normal duration accumulator circuit includes a clear counter circuit configured to increment its count whenever the free-running counter circuit outputs the count-up signal, and further configured to output the clear signal when its count value reaches a reference clear count value, and further includes a normal duration reset circuit configured to reset a count value of the clear counter circuit based on an output of the first abnormal current signal from the first abnormal current detecting circuit.

According to the present invention, the count of the anomaly time by the anomaly time accumulator circuit and the count of the normal duration by the normal duration accumulator circuit are both performed based on the count by the common free-running counter circuit. Thereby, the circuit construction can be simplified compared to a construction in which the accumulating operation of the anomaly time accumulator circuit and the accumulating operation of the normal duration accumulator circuit are performed completely independently.

Preferably, a latch circuit, configured to maintain a shutoff state of the semiconductor switching element caused by the anomaly time accumulator circuit, is further included. Thereby, the shutoff state of the semiconductor switching element due to the anomaly time of the anomaly time accumulator circuit reaching the first reference time can be maintained. That is, the semiconductor switching element can be maintained to a self-unrestorable state in which a conductive state cannot be restored unless an external input for requesting a conductive state of the semiconductor switching element during a normal state is turned off or the power source is turned off, for example.

BRIEF DESCRIPTION OF THE DRAWINGS

FIG. 6B is a graph showing the relation between the gate voltage and discharging time;

FIG. 20 is a table showing a correspondence relation between count values, of a fuse counter and an FR counter, and a threshold designation signal;

BEST MODE FOR CARRYING OUT THE INVENTION

First Embodiment

A first embodiment according to the present invention will be explained with reference to FIGS. 1 through 7.

(1) General Construction

Figure 1:
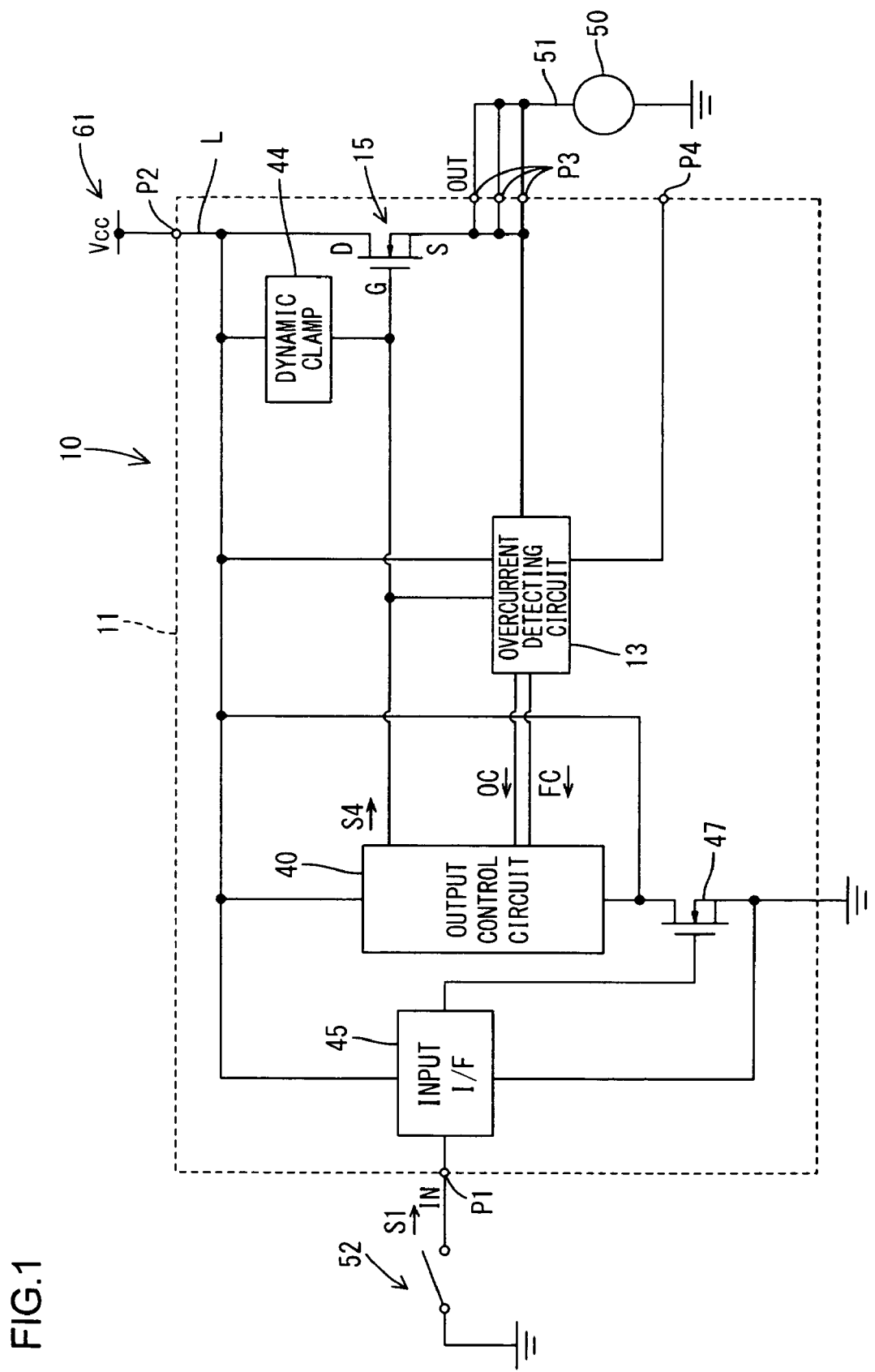
FIG. 1 is a block diagram showing the general construction of a power supply controller according to a first embodiment of the present invention.

FIG. 1 is a block diagram showing the general construction of a power supply controller 10 according to the present embodiment. As shown in the figure, the power supply controller 10 of the present embodiment provides a control signal S1 such as a constant voltage signal or a PWM (Pulse Width Modulation) control signal directly or indirectly to the control input terminal (i.e., the gate terminal G) of a power MOSFET 15 (i.e., an example of "a semiconductor switching element" and "a power FET"), so as to control the power supply from a vehicle power source 61 (hereinafter referred to as "a power source 61"), connected to the output side of the power MOSFET 15, to a load 50. In the present embodiment, the power supply controller 10 is installed on a vehicle not shown, and used for drive control for the load 50 such as a vehicle lamp, a cooling fan motor or a defogger heater. An operation switch 52 is connected to an input terminal P1 of the power supply controller 10, which operates when the operation switch 52 is turned ON. Hereinafter, "a load" means a device to be controlled by the power supply controller 10, and does not include an electric wire 51 connected between the power supply controller 10 and the controlled device. The load 50 and the electric wire 51 are collectively called "an external circuit" in the following explanation.

As shown in FIG. 1, the control signal S1 is inputted to an input interface 45 connected to the input terminal P1. In response to a control signal S1 (of low level), an FET 47 turns on so that an output control circuit 40 operates. The output control circuit 40 includes a charge pump/gate driver circuit 41 (See FIGS. 2 and 4), and an overcurrent detecting circuit 13 is connected thereto. A dynamic clamp 44 is connected between the drain terminal D and the gate terminal G of the power MOSFET 15.

The charge pump/gate driver circuit 41 of the output control circuit 40 is connected to the gate terminal G of the power MOSFET 15 and the gate terminal G of a sense MOSFET 16 described below (See FIG. 2) of the overcurrent detecting circuit 13. The charge pump/gate driver circuit 41 is also connected to the source terminal S of the power MOSFET 15. An external resistor 64, which is omitted in FIG. 1, is connected to an external terminal P4 of a semiconductor device 11 (a semiconducting device), and a sense current Is (i.e., an example of "a detection signal") described below from the sense MOSFET 16 passes into the ground via the external resistor 64.

As shown in FIG. 1, the power MOSFET 15, the overcurrent detecting circuit 13, the output control circuit 40 and the like, i.e., the circuit constructions within the dotted frame in the figure, of the power supply controller 10 are configured onto a single chip or a plurality of chips housed in a package so as to form the semiconductor device 11.

(2) Overcurrent Detecting Circuit

Figure 2:
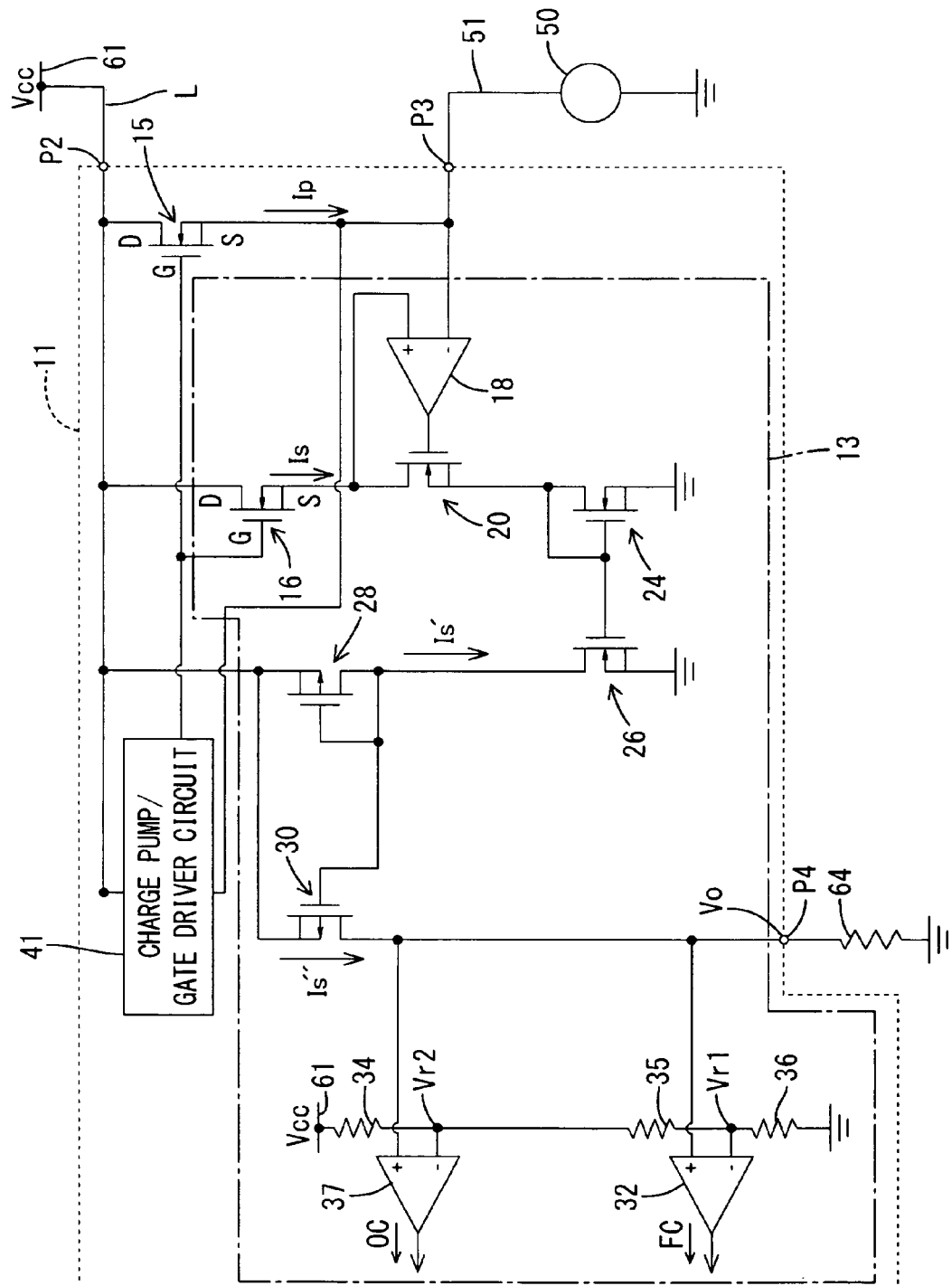
FIG. 2 is a circuit diagram mainly showing an overcurrent detecting circuit.

FIG. 2 is a circuit diagram mainly showing the overcurrent detecting circuit 13 (i.e., an example of "first and second abnormal current detecting circuits") for detecting an anomaly of a current passing through the power MOSFET 15. In the figure, the constructions within the dashed-dotted frame correspond to the overcurrent detecting circuit 13. The overcurrent detecting circuit 13 includes the sense MOSFET 16 (i.e., an example of "a sense FET" and "a current detecting element"), through which a sense current Is, corresponding to the amount of a current of the power MOSFET 15, passes.

Specifically, a plurality of MOSFETs are arranged on the semiconductor device 11. The drain terminals D of the MOSFETs are connected in common to one another, and connected to a power supply terminal P2. The source terminals S of most of the MOSFETs are connected in common to an output terminal P3, so that the MOSFETs form the power MOSFET 15. The source terminals S of the rest of the MOSFETs are connected to an FET 20, so that the MOSFETs form the sense MOSFET 16. The ratio of the number of MOSFETs constituting the sense MOSFET 16 to the number of MOSFETs constituting the power MOSFET 15 corresponds approximately to a sense ratio.

The source terminal S of the power MOSFET 15 and the source terminal S of the sense MOSFET 16 are connected to the respective input terminals of an operational amplifier 18. The gate terminal of the FET 20 is connected to the output side of the operational amplifier 18.

Thus the potentials of the drain terminals D of the power MOSFET 15 and the sense MOSFET 16 are maintained equal to each other, and the potentials of the source terminals S thereof are also maintained equal to each other. Thereby the sense current Is passing through the sense MOSFET 16 is stably maintained to a constant ratio (i.e., the above sense ratio) to the load current Ip passing through the power MOSFET 15. The power MOSFET 15 and the sense MOSFET 16 are turned ON (i.e., switched from a shutoff state to a conductive state) on condition that a control signal S1 (of low level) is inputted to the input terminal P1 in response to the operation switch 52 being turned ON. A line L connected between the power source 61 and the load 50 is an example of "a power supply line".

An FET 24 and an FET 26 form a current mirror circuit, and thereby a mirror current Is' of the same level as the sense current Is from the sense MOSFET 16 passes on the connecting line between the FET 26 and an FET 28. Further the FET 28 and an FET 30 form a current mirror circuit, and thereby a mirror current Is" of the same level as the sense current Is passes through the FET 30 and the external terminal P4.

An input terminal of a comparator 32 is connected to the connecting line between the FET 30 and the external terminal P4. Three resistors 34, 35, 36 are serially connected between a power line, connected to the power source 61, and the ground, for example. The other input terminal of the comparator 32 is connected to a connecting point between the resistor 35 and the resistor 36. An input terminal of a comparator 37 is connected to the connecting line between the FET 30 and the external terminal P4. The other input terminal of the comparator 37 is connected to a connecting point between the resistor 34 and the resistor 35.

When the voltage Vo at the external terminal P4, to which the external resistor 64 is connected, exceeds a first threshold voltage Vr1 at the connecting point between the resistor 35 and the resistor 36, the comparator 32 turns on so as to output an anomaly signal FC of high level (i.e., an example of "a first abnormal current signal"). On the other hand, the comparator 37 turns on so as to output an anomaly signal OC of high level (i.e., an example of "a second abnormal current signal"), when the voltage Vo at the external terminal P4, to which the external resistor 64 is connected, exceeds a second threshold voltage Vr2 (higher than the first threshold voltage Vr1) at the connecting point between the resistor 34 and the resistor 35. Hereinafter, a load current Ip during a current anomaly, which passes through the power MOSFET 15 when the voltage Vo at the external terminal P4 reaches the first threshold voltage Vr1, is referred to as "a fist threshold current Ia". A load current Ip during a current anomaly, which passes through the power MOSFET 15 when the voltage Vo at the external terminal P4 reaches the second threshold voltage Vr2, is referred to as "a second threshold current Ib".

Figure 3:
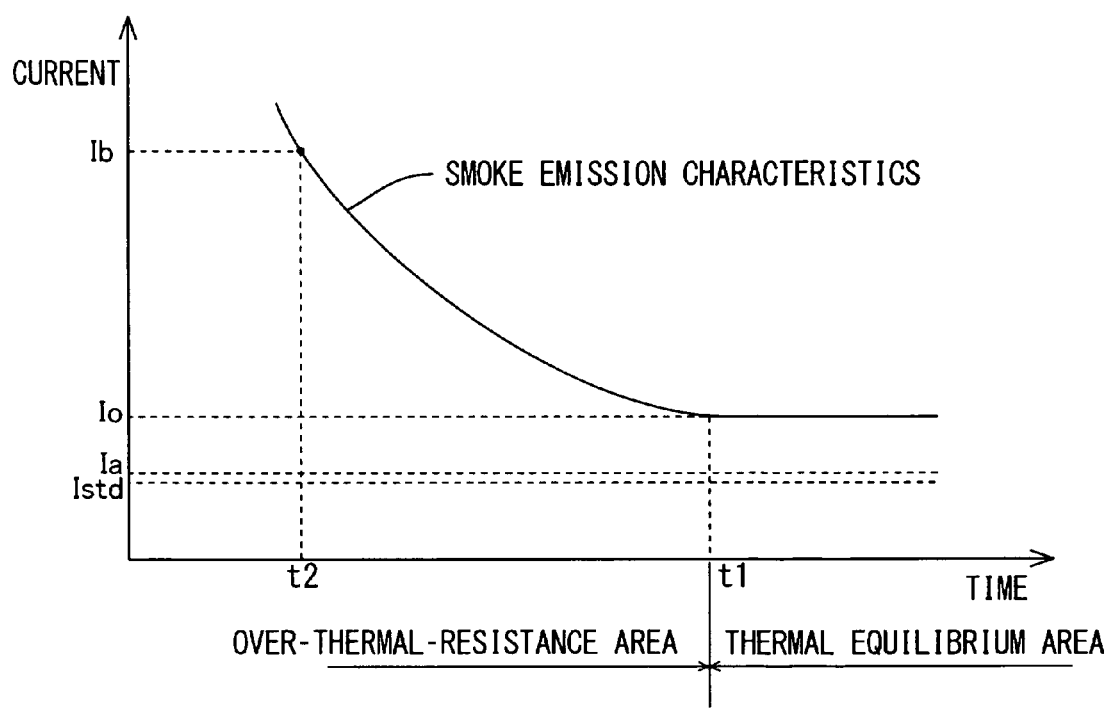
FIG. 3 is an explanatory diagram illustrating smoke emission characteristics.

FIG. 3 is a graph showing smoke emission characteristics of an external circuit such as an electric wire 51 (e.g., the coating material of the electric wire) connectable to the power supply controller 10 of the present embodiment, which represents the relation between a current level and a current-applying time (i.e., a time taken for fusing).

That is, a time taken for the coating material of the electric wire 51 to begin to burn, while an arbitrary constant current (i.e., a one shot current) is applied to the electric wire 51, is shown. The graph shows smoke emission characteristics of the electric wire 51 to be connected to the power supply controller 10. Smoke emission characteristics depends on an external circuit (e.g., a wiring member such as an electric wire, or a load) to be actually connected to the power supply controller 10, and therefore the levels of the sense current Is, based on which the above anomaly signals FC, OC are outputted, should be changed depending thereon. That can be readily achieved by adjusting the resistance value of the above-described external resistor 64.

In the graph, ILmax represents the rated current of the load 50 (i.e., a limit of use against which the design thereof is guaranteed). Io represents the equilibrium critical current that can be applied while maintaining a thermal equilibrium state in which heat generation and radiation in the electric wire 51 are balanced. If a current of a higher level than the equilibrium critical current Io is applied, that relates to the over-thermal-resistance area in which a current level and a time taken for smoke emission are substantially in inverse proportion to each other. The comparator 32 detects a first current anomaly (hereinafter, referred to as "a fuse current"), i.e., when the load current Ip passing through the power MOSFET 15 reaches the first threshold current Ia slightly higher than the rated current ILmax of the load 50, and outputs an anomaly signal FC (of high level). If the load current is around this level, the power MOSFET 15 does not need to be turned OFF immediately as described below. It should be turned OFF, if the fuse current state continues for a considerable time.

In contrast, the comparator 37 detects a second current anomaly (hereinafter, referred to as "an overcurrent"), i.e., when the load current Ip passing through the power MOSFET 15 reaches the second threshold current Ib higher than the first threshold current Ia, and outputs an anomaly signal OC (of high level). When the load current Ip is such a high level as to exceed the second anomaly threshold current Ib, the power MOSFET 15 should be turned OFF immediately as described below.

(3) Output Control Circuit

Figure 4:
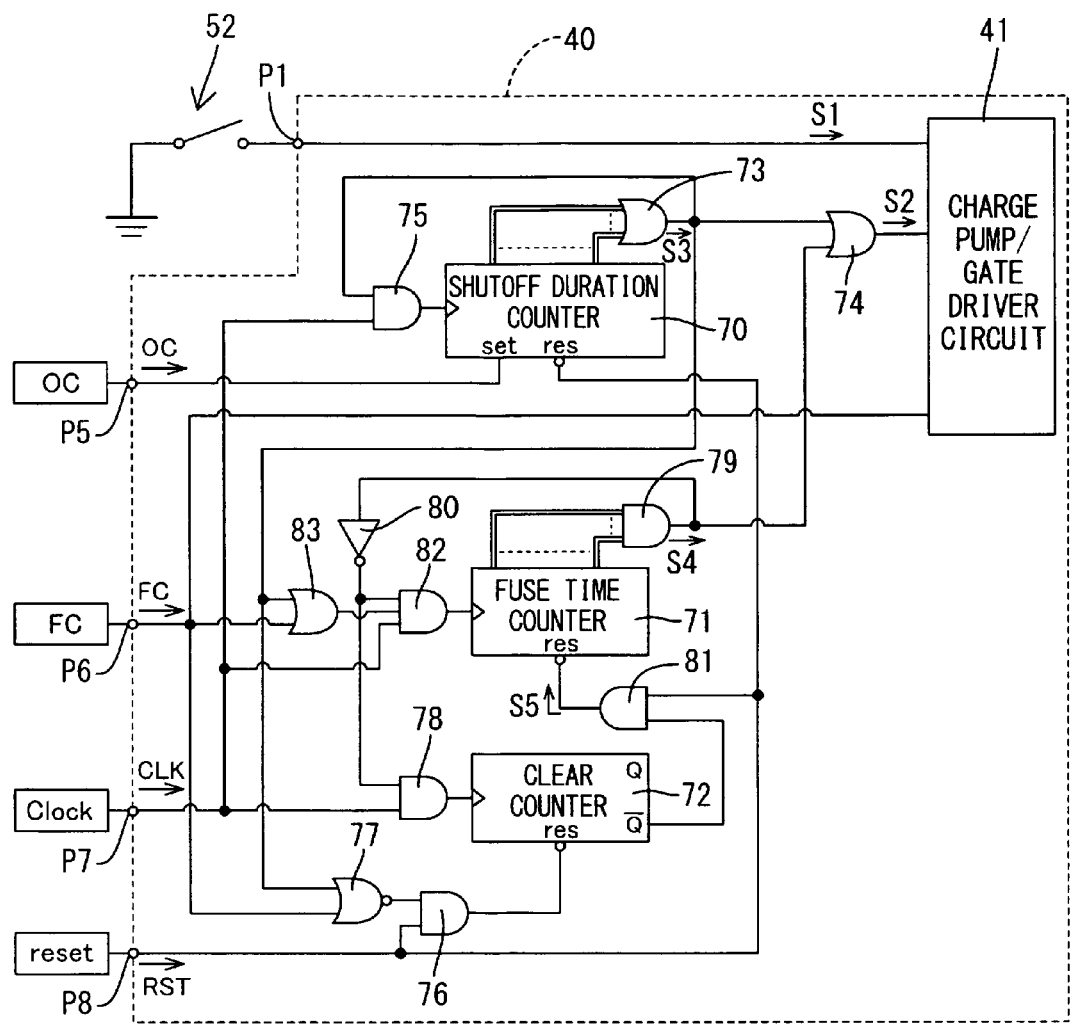
FIG. 4 is a circuit diagram showing the construction of an output control circuit.

FIG. 4 is a circuit diagram showing the construction of the output control circuit 40. As shown in the figure, the output control circuit 40 mainly includes the charge pump/gate driver circuit 41, a shutoff duration counter 70, a fuse time counter 71 and a clear counter 72. The output control circuit 40 further includes the above input terminal P1 for receiving the control signal S1, an input P5 for receiving the anomaly signal OC, an input P6 for receiving the anomaly signal FC, an input P7 for receiving a clock signal CLK, and an input P8 for receiving a reset signal RST.

a. Charge Pump/Gate Driver Circuit

Figure 5:
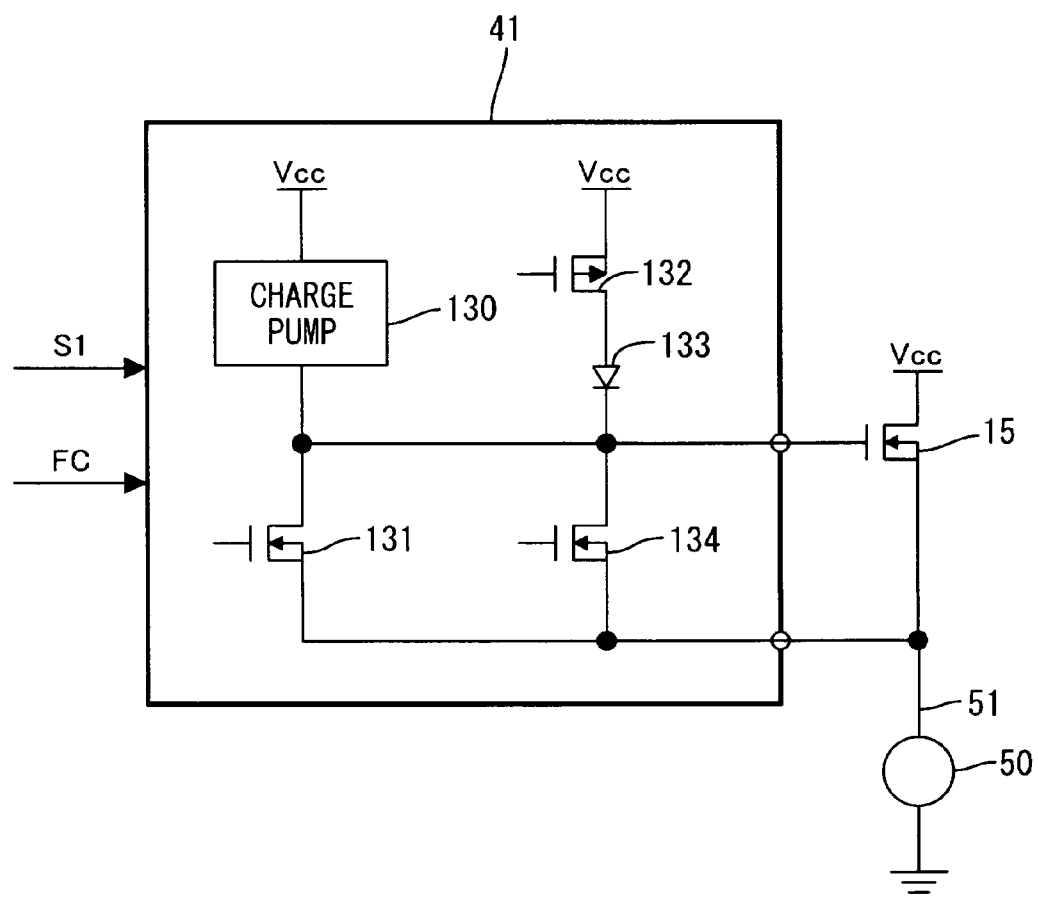
FIG. 5 is a schematic diagram showing the construction of a charge pump/gate driver circuit.
Figure 6A:
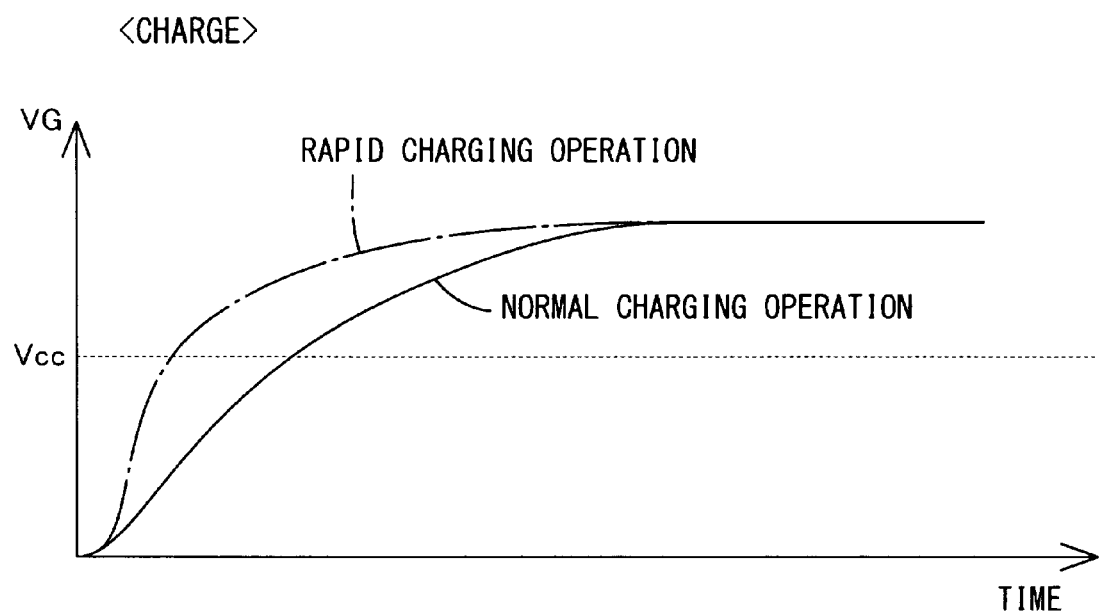
FIG. 6A is a graph showing the relation between the gate voltage and charging time.

FIG. 5 is a schematic diagram showing the construction of the charge pump/gate driver circuit 41. The charge pump/gate driver circuit 41 includes a charge pump 130 connected between the power supply terminal P2 and the gates of the power MOSFET 15 and the sense MOSFET 16 (omitted in the figure), and further includes a normal discharge FET 131 connected between the gates and sources of the power MOSFET 15 and the sense MOSFET 16. Moreover, the charge pump/gate driver circuit 41 includes an urgent charge FET 132 and a diode 133 connected between the power supply terminal P2 and the gates of the power MOSFET 15 and the sense MOSFET 16, and further includes an urgent discharge FET 134 connected between the gates and sources of the power MOSFET 15 and the sense MOSFET 16.

In a normal state (wherein neither a fuse current nor an overcurrent has occurred), the charge pump 130 is solely driven in response to a control signal S1 of low level, so that a higher voltage is generated from the power supply voltage Vcc and applied between the gates and sources of the power MOSFET 15 and the sense MOSFET 16 for turning on or switching to a conductive state. Thus a normal charging operation is performed (See FIG. 6A). On the other hand, in response to a control signal S1 of high level, the generation of a higher voltage by the charge pump 130 is discontinued and the normal discharge FET 131 is solely turned on so that discharge from between the gates and sources of the power MOSFET 15 and the sense MOSFET 16 is performed for switching to a shutoff state. Thus a normal discharging operation is performed (See FIG. 6B).

The charge pump/gate driver circuit 41 is also connected to the output terminal of an OR circuit 74 described below. In response to a forcing shutoff signal S2 (of high level) therefrom, the generation of a higher voltage is also discontinued while the charge between the gates and sources (i.e. the gate charge) of the power MOSFET 15 and the sense MOSFET 16 is released. Thus a forcing shutoff operation is performed (hereinafter, a shutoff operation performed based on the forcing shutoff signal S2 is referred to as "a forcing shutoff operation").

During the forcing shutoff operation performed based on the forcing shutoff signal S2, the charge pump/gate driver circuit 41 releases the gate charge at a higher rate than that during a normal shutoff operation performed based on a control signal S1 (of high level). Thereby the forcing shutoff operation is performed more rapidly than a normal shutoff operation. Thus the charge pump/gate driver circuit 41 also functions as "a discharge rate changing circuit" of the present invention. Specifically, the charge pump/gate driver circuit 41 turns on the normal discharge FET 131 and also the urgent discharge FET 134 in response to a forcing shutoff signal S2 (of high level), so that discharge from between the gates and sources of the power MOSFET 15 and the sense MOSFET 16 is rapidly performed for a shutoff operation. Thus a rapid discharging operation is performed (See FIG. 6B).

Further, the charge pump/gate driver circuit 41 receives an anomaly signal FC (of high level) from the input P6, and raises a voltage-increasing rate in response to the anomaly signal FC (of high level). That is, a charge rate for charge between the gates and sources of the power MOSFET 15 and the sense MOSFET 16 (i.e., for gate charge) is changed to a higher rate than that for a normal state, so that the load current Ip and the sense current Is increase precipitously (See the graph of the sense current Is in FIG. 7). Thereby the overcurrent detecting circuit 13 can detect an overcurrent more early. Thus the charge pump/gate driver circuit 41 functions also as "a charge rate changing circuit" of the present invention. Specifically, the charge pump/gate driver circuit 41 turns on the charge pump 130 and also the urgent charge FET 132 in response to an anomaly signal FC (of high level), so that the voltage rapidly rises to the power supply voltage Vcc. Thus a rapid charging operation is performed (See FIG. 6A).

b. Shutoff Duration Counter

The shutoff duration counter 70 (i.e., an example of "a shutoff duration accumulator circuit" of the present invention) counts down from the initial value n to zero in synchronization with clocking of the above clock signal CLK. Specifically, the input P5 is connected to the set terminal of the shutoff duration counter 70 so that an anomaly signal OC (of high level) can be inputted. The input P8 is connected to the reset terminal thereof so that a reset signal RST (of high level) is level-inverted and inputted.

Further, n output terminals corresponding to the respective count values of the shutoff duration counter 70 are connected to the respective input terminals of an OR circuit 73. An output signal from the OR circuit 73 is applied to one of the input terminals of the OR circuit 74. An output signal of an AND circuit 75 is applied to the clock input terminal of the shutoff duration counter 70. The clock signal CLK from the input P7 and the output signal S3 of the OR circuit 73 are inputted to the AND circuit 75.

According to this construction, the shutoff duration counter 70 performs the countdown in synchronization with clocking of the clock signal CLK beginning with the initial state wherein all the n counters are "1" and therefore all the n output terminals are high level, when an anomaly signal OC is inputted to the set terminal thereof.

Unless and until the shutoff duration counter 70 completes the countdown to "0", the output terminal S3 of the OR circuit 73 is high level, and therefore the clock signal CLK is validated by the AND circuit 75 so as to be inputted to the clock terminal of the shutoff duration counter 70. During this time, an output signal S3 of high level is applied as the above forcing shutoff signal S2 to the charge pump/gate driver circuit 41 via the OR circuit 74. In contrast, the output terminal S3 of the OR circuit 73 turns to low level, when the shutoff duration counter 70 completes the countdown to "0" and thereby all the n output terminals are inverted to low level. Then the clock signal CLK are invalidated by the AND circuit 75 so that the countdown operation of the shutoff duration counter 70 stops. At the time, the output signal S3 of low level is applied to the OR circuit 74.

Figure 7:
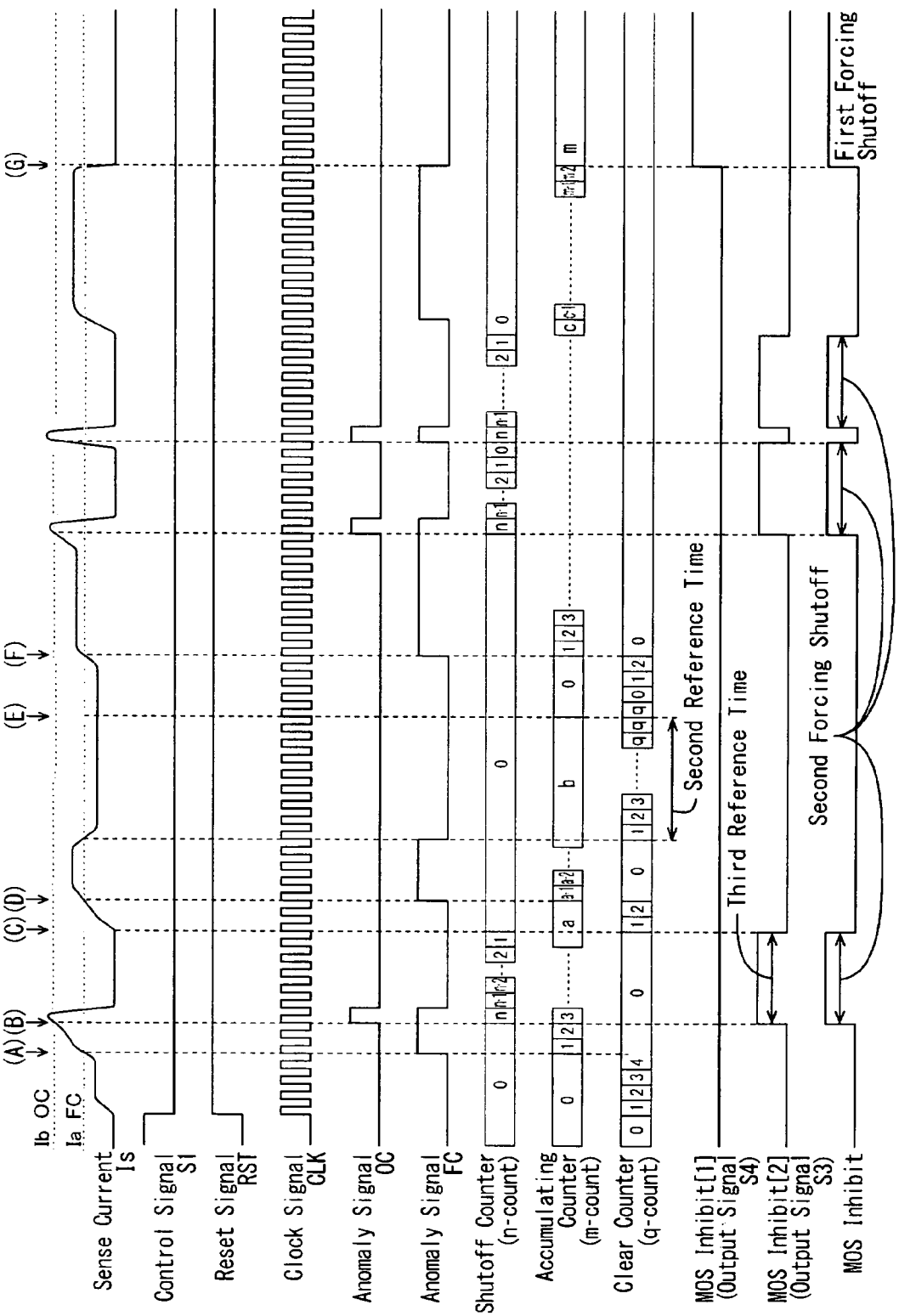
FIG. 7 is a timing chart illustrating an operation of the output control circuit.

That is, as shown in FIG. 7 (See the timing charts of the shutoff counter and MOS inhibition [2]), the shutoff duration counter 70 immediately initiates the above forcing shutoff operation for the power MOSFET 15 whenever the overcurrent detecting circuit 13 outputs an anomaly signal OC in response to an overcurrent state, and releases the forcing shutoff operation after the countdown from n is completed (hereinafter, this forcing shutoff operation (i.e., an example of "second shutoff") is referred to as "a second forcing shutoff operation"). A time having been measured by the countdown operation of the shutoff duration counter 70 corresponds to "a shutoff duration" of the present invention, and a time measured by the overall countdown from n is an example of "a third reference time" of the present invention. The third reference time is set to a time shorter than the time t2 that corresponds to the second threshold current Ib on the smoke emission characteristics curvature in the FIG. 3.

c. Clear Counter

The clear counter 72 (i.e., an example of "a normal duration accumulator circuit" and "a clear counter circuit") counts up from the initial value 0 to q (q>n) in synchronization with clocking of the clock signal CLK. Specifically, the reset terminal of the clear counter 72 is connected to the output terminal of an AND circuit 76 so as to receive the level-inverted signal of an output signal from the AND circuit 76. A time having been measured by the count-up operation of the clear counter 72 corresponds to "a normal duration" of the present invention, and a time measured by the overall count to q is an example of "a second reference time". The second reference time is determined based on the time taken for elimination of an overheat state of the load or the like after elimination of a fuse current or overcurrent state, for example.

A reset signal RST is inputted to the AND circuit 76 via the input P8, and an output signal from a NOR circuit 77 is also inputted. An anomaly signal FC is inputted to the NOR circuit 77 via the input P6, and an output signal S3 of the OR circuit 73 is also inputted.

According to this construction, as shown in the timing chart of the clear counter in FIG. 7, the count value of the clear counter 72 is reset to the initial value "0", when the overcurrent detecting circuit 13 outputs an anomaly signal FC in response to an fuse current state or while the shutoff duration counter 70 is performing the countdown operation due to an overcurrent state.

The output terminal of an AND circuit 78 is connected to the clock terminal of the clear counter 72. The AND circuit 78 receives the clock signal CLK via the input P7. Further an output signal S4 from an AND circuit 79 described below is level-inverted by an inverting circuit 80, and received by the AND circuit 78. According to this construction, unless and until the fuse time counter 71 overflows, the clock signal CLK is validated by the AND circuit 78, and therefore the clear counter 72 performs the count-up operation in synchronization with clocking of the clock signal CLK. In contrast, when the fuse time counter 71 has overflowed, the clock signal CLK is invalidated by the AND circuit 78 so that the count-up operation stops.

Further, one of the input terminals of an AND circuit 81 (i.e., an example of "anomaly time clear circuit") is connected to the Q inverting terminal of the clear counter 72. The input P8 is connected to the other input terminal of the AND circuit 81 so that a reset signal RST (of high level) is received.

d. Fuse Time Counter

The fuse time counter 71 (i.e., an example of "an anomaly time accumulator circuit") counts up from the initial value 0 to m (m>n) in synchronization with clocking of the clock signal CLK. Specifically, an output signal of the AND circuit 81 is level-inverted and inputted to the reset terminal of the fuse time counter 71. Thereby the fuse time counter 71 is cleared (i.e., reset to the initial value "0"), when the clear counter 72 completes the count to "q" and overflows. A time (i.e., a fuse time) having been measured by the count-up operation of the fuse time counter 71 is an example of "an anomaly time" of the present invention, and a time measured by the overall count to m is an example of "a first reference time". In the present embodiment, the first threshold current Ia is set to a level slightly higher than the rated current ILmax of the load 50. The first reference time is set to a time shorter than the time taken for smoke emission of the electric wire 51 in the case that a current corresponding to the first threshold current Ia is intermittently detected at intervals shorter than the second reference time. Therefore a chattering short, i.e., an abnormal current passing through a fraction of the stranded wires of the electric wire 51 at intervals shorter than the second reference time due to short-circuiting in the fraction of the stranded wires, can be detected so that the forcing shutoff is performed for the power MOSFET 15 without the electric wire 51 reaching smoke emission.

M output terminals corresponding to the respective count value of the fuse time counter 71 are connected to the input terminals of the AND circuit 79. The output signal S4 from the AND circuit 79 is applied to the OR circuit 74. Further, the output terminal of an AND circuit 82 is connected to the clock terminal of the fuse time counter 71. The AND circuit 82 receives the clock signal CLK, the level-inverted signal of the output signal S4 of the AND circuit 79, and an output signal of an OR circuit 83. The OR circuit 83 receives an anomaly signal FC and the output signal S3 of the OR circuit 73.

According to this construction, the fuse time counter 71 performs the count-up operation in synchronization with clocking of the clock signal CLK, when the overcurrent detecting circuit 13 outputs an anomaly signal FC or while the shutoff duration counter 70 is performing the countdown operation, as shown in the timing chart of the accumulating counter in FIG. 7. In contrast, when an anomaly signal FC is not outputted and the shutoff duration counter 70 is not performing the countdown operation, the fuse time counter 71 stops the count-up operation because the clock signal CLK is not received. Once the fuse time counter 71 completes the count to "m" and overflows, it will not receive the clock signal CLK and therefore an output signal S4 of high level from the AND circuit 79 is continuously applied to the OR circuit 74. Then the forcing shutoff signal S2 from the OR circuit 74 is continuously applied to the charge pump/gate driver circuit 41.

That is, if the fuse time counter 71 once receives an anomaly signal FC, it performs the count-up operation while the anomaly signal FC is continuously received or the shutoff duration counter 70 is performing the countdown operation. When the count to "m" is completed, without a reset signal (i.e., a low-level output signal from the AND circuit 81) being received due to a clear signal S5 from the clear counter 72, resulting in overflow, the forcing shutoff operation is performed for the power MOSFET 15 (See the timing chart of MOS inhibit [1] in FIG. 7. Hereinafter, this forcing shutoff operation (i.e., an example of "first shutoff") is referred to as "a first forcing shutoff operation"). Thereby, a fuse current or overcurrent state can be eliminated. However, the clear counter 72 will not overflow, because the clock signal CLK is not received. Therefore the fuse time counter 71 will not be reset, and the first forcing shutoff operation is maintained.

Thus the clear counter 72, the AND circuit 78 and the like function as "a latch circuit" of the present invention.

2. Operation and Effect of Power Supply Controller

The operation and effect of the power supply controller 10 during a current anomaly will be explained with reference to the timing charts shown in FIG. 7.

If a control signal S1 is inputted to the input terminal P1, the charge pump/gate driver circuit 41 turns on the power MOSFET 15 and the sense MOSFET 16, i.e., turns to a conductive state, and thereby the power supply to the load 50 starts. If the sense current Is exceeds the first threshold current Ia, i.e., a fuse current state occurs (at a time (A) in FIG. 7), the overcurrent detecting circuit 13 outputs an anomaly signal FC (of high level) and the fuse time counter 71 starts a count-up operation from the count value "0". At this time, the clear counter 72 is cleared in response to the anomaly signal FC, so that its count value is "0".

If the sense current Is further increases and exceeds the second threshold current Ib, that is, an overcurrent state occurs (at a time (B) in FIG. 7), the overcurrent detecting circuit 13 outputs an anomaly signal OC (of high level). Thereby the shutoff duration counter 70 starts a countdown operation from the initial value "n", and a forcing shutoff signal S2 is applied to the charge pump/gate driver circuit 41 so that a second forcing shutoff operation is performed for the power MOSFET 15 and the like (See the timing chart of MOS inhibit in FIG. 7). At this time, the fuse time counter 71 continues the count-up operation. However, the clear counter 72 maintains a state wherein its count value is cleared to be "0" based on an output signal S3 (of high level) from the OR circuit 73.

Thereafter the output signal S3 of the OR circuit 73 inverts to low level, when the shutoff duration counter 70 completes the countdown to the count value "0" (i.e., when a third reference time has elapsed). Then the forcing shutoff signal S2 will not be applied to the charge pump/gate driver circuit 41, and therefore the second forcing shutoff operation for the power MOSFET 15 and the like is released so that the conductive state is restored. At the time, the clear counter 72, which has been cleared to be "zero", starts a count-up operation, because the sense current Is falls below the first threshold current Ia. Thereafter, as long as the sense current Is is lower than the first threshold current Ia, the fuse time counter 71 suspends the count-up operation while maintaining its count value to [a] (0<a<m). If the sense current Is exceeds the first threshold current Ia again (at a time (D) in FIG. 7), the fuse time counter 71 resumes the count-up operation from the count value [a], and the clear counter 72 is cleared to be "zero" without reaching the count value "q".

Thereafter, if the sense current Is is maintained lower than the first threshold current Ia continuously for a considerable time and the clear counter 72 completes the count-up operation to the count value "q" (at a time (E) in FIG. 7) without being cleared, the accumulated count value "b" (a<b<m) of the fuse time counter 71 is cleared to be "zero", without reaching the count value "m", in response to a clear signal S5 from the clear counter 72.

If the sense current Is thereafter exceeds the first threshold current Ia again (at a time (F) in FIG. 7), the fuse time counter 71 restarts the count-up operation. The output signal S4 from the AND circuit 79 inverts to high level, if the fuse time counter 71 completes the count-up operation to the count value "m" (at a time (G) in FIG. 7.) without a clear signal S5 being received due to overflow of the clear counter 72. In response to this, a forcing shutoff signal S2 is applied to the charge pump/gate driver circuit 41 so that the first forcing shutoff operation is performed for the power MOSFET 15 and the like. Then the clear counter 72 will not receive the clock signal CLK, and therefore overflow will not occur. This means that clearance of the fuse time counter 71 due to a clear signal S5 from the clear counter 72 will not be performed and therefore the first forcing shutoff operation (i.e., self-unrestorable forcing shutoff operation) is maintained. Thus a latch function is achieved in the present embodiment. The first forcing shutoff operation is not released unless a reset signal RST is externally inputted to the power supply controller 10 again, for example.

As described above, according to the present embodiment, a first forcing shutoff operation is performed for the power MOSFET 15 and the like, when the load current (or the sense current Is) passing on the power supply line L continuously exceeds the first threshold current Ia (slightly higher than the rated current ILmax of the load 50) for a first reference time. On the other hand, if a normal state, wherein an overcurrent or fuse current has not occurred, continues for a second reference time without the first reference time being reached, the count value of the fuse time counter 71 is cleared to be "zero" so that a shutoff operation for the power MOSFET 15 and the like is not performed. Thereby, protection of the external circuit against a current anomaly can be achieved when a chattering short occurs, i.e., an intermittent current occurs at intervals shorter than the second reference time, as well as when an abnormal current Io (i.e., a sense current corresponding to Ia or Ib) continuously occurs, while preventing a shutoff operation for the power MOSFET 15 and the like from being performed due to an inrush current when power supply to the load 50 starts.

Second Embodiment

Figure 8:
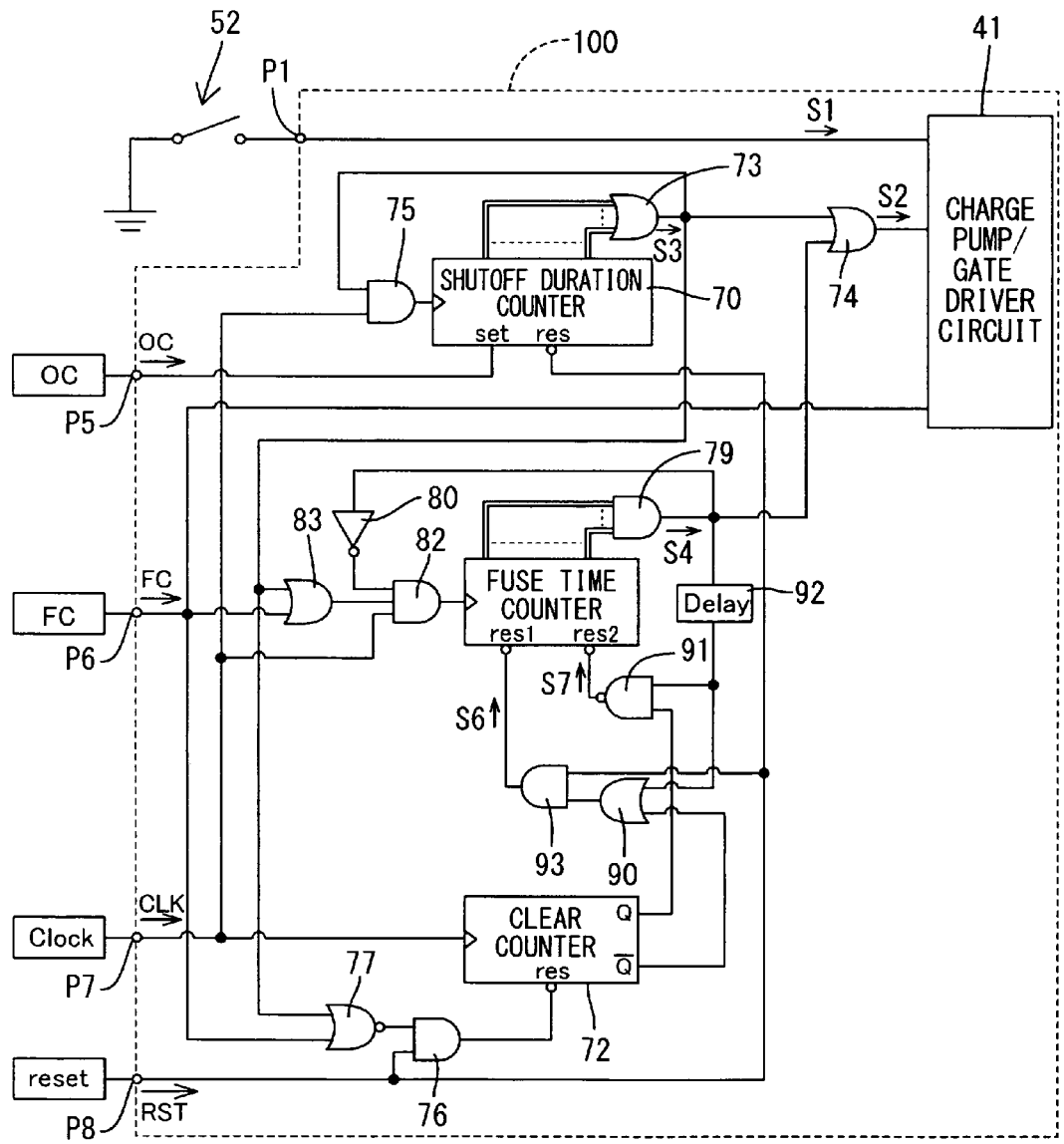
FIG. 8 is a circuit diagram showing the construction of an output control circuit according to a second embodiment.
Figure 9:
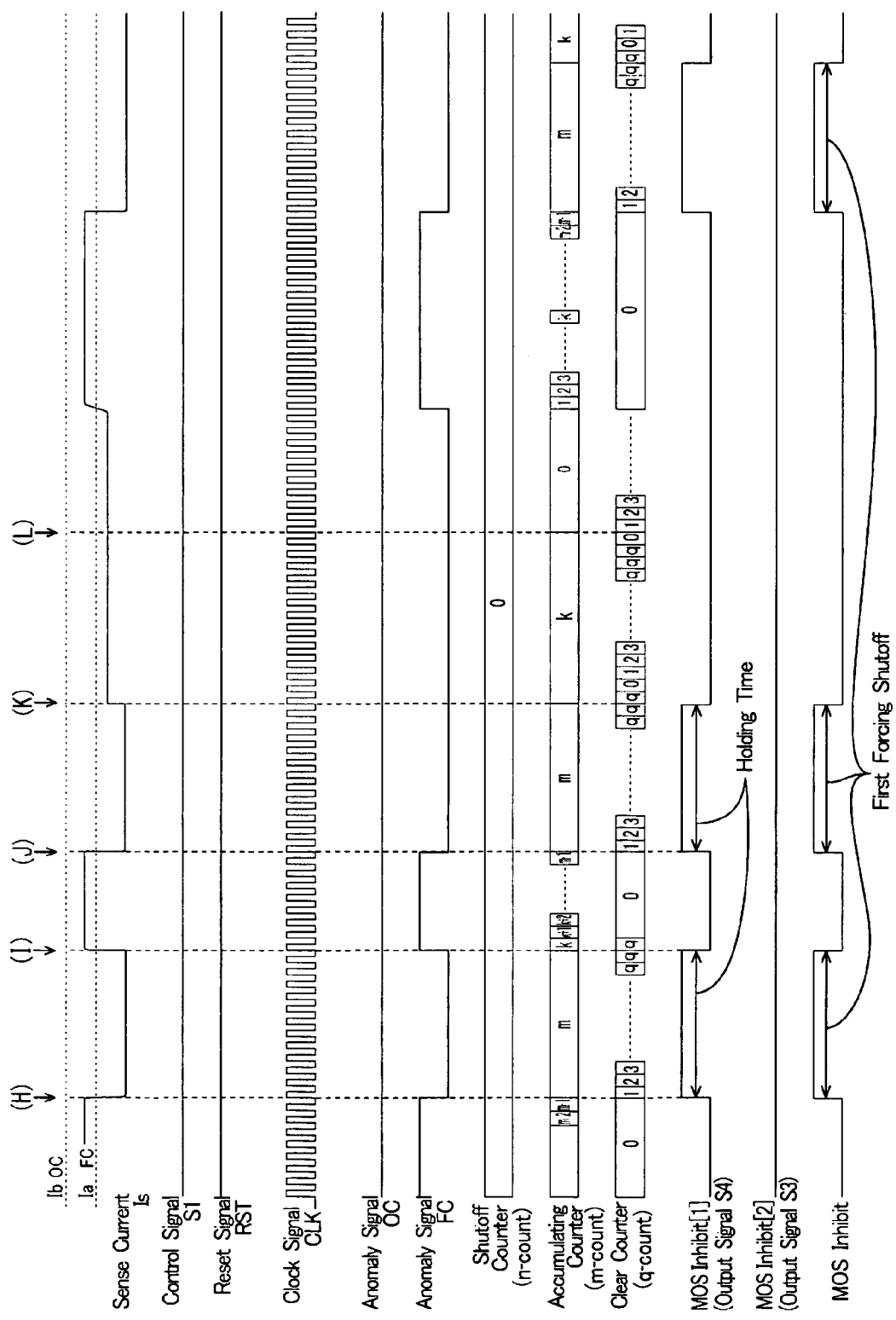
FIG. 9 is a timing chart illustrating an operation of the output control circuit.

FIGS. 8 and 9 show a second embodiment. The present embodiment has difference from the above embodiment in the circuit construction of a part of an output control circuit. The other portions are similar to the first embodiment, and therefore designated by the same symbols as the first embodiment. Redundant explanations are omitted, and the following explanation will be concentrated on the difference.

1. Construction of the Present Embodiment

The output control circuit 40 of the first embodiment has a latch function, and thereby a first forcing shutoff operation, which has been once performed, is not released unless a reset signal RST of high level is inputted again. In contrast, the output control circuit 100 of the present embodiment does not have a latch function, and a first forcing shutoff operation, which has been performed, is released when a holding time expires.

Specifically, as shown in FIG. 8, the input P7 is directly connected to the clock terminal of the clear counter 72 so that the clock signal CLK is consistently received. An output signal from the Q inverting terminal of the clear counter 72 is applied to an OR circuit 90, while an output signal from the Q terminal is applied to a NAND circuit 91. The OR circuit 90 receives an output signal from the AND circuit 79 via a delay (delaying) circuit 92, and an output signal thereof is applied to an AND circuit 93. The AND circuit 93 also receives a reset signal RST, and an output signal S6 thereof is level-inverted and applied to a first reset terminal of the fuse time counter 71. The NAND circuit 91 receives an output signal of the AND circuit 79 via the delay (delaying) circuit 92, and an output signal S7 thereof is level-inverted and applied to a second reset terminal of the fuse time counter 71.

The fuse time counter 71 clears all the "m" counters to be the initial value "0", when an output signal S6 is received on the first reset terminal. On the other hand, when an output signal S7 is received on the second reset terminal, some of the counters are cleared so that the count value is "k" (0<k<m). Thus the clear counter 72, the NAND circuit 91, the AND circuit 93 and the like function also as "a release circuit" of the present invention.

2. Operation and Effect of the Present Embodiment

The operation of the present embodiment during a current anomaly and effect thereof will be explained with reference to the timing charts shown in FIG. 9. FIG. 9 relates to an operation after the fuse time counter 71 has once reached the count value "m" and overflowed. The operation before the overflow is substantially similar to that shown in FIG. 7.

If the fuse time counter 71 first completes the count to "m" (at a time (H) in FIG. 9) after the output control circuit 100 starts to operate, a first forcing shutoff operation is performed for the power MOSFET 15 and the like (See the timing chart of MOS inhibit in the figure). Then the sense current Is decreases, resulting in falling below the first threshold current Ia. The clock signal CLK is continuously inputted to the clear counter 72, and therefore the count-up operation in synchronization with clocking of the clock signal CLK is started then.

When the clear counter 72 completes the count to "q" (at a time (I) in FIG. 9), the count value of the fuse time counter 71 is partially cleared to be "k" based on the output signal S7. Thereby the output signal S4 of the OR circuit 79 inverts to low level, so that the first forcing shutoff operation is released. A time measured by the count operation of the clear counter 72 from "0" to "q" is an example of "a holding time" of the present invention. Thereafter the fuse time counter 71 resumes the count-up operation from the count value "k", if the sense current Is exceeds the first threshold current Ia again. When the count value reaches "m" (at a time "J" in FIG. 9), the first forcing shutoff operation is performed again, and the clear counter 72 is cleared to be "zero".

Thus, according to the present embodiment, a first reference time counted by the fuse time counter 71 for a first forcing shutoff operation to be performed for the second time or more (i.e., a time measured by the count from "k" to "m") is shorter than a first reference time counted by the fuse time counter 71 for a first forcing shutoff operation to be performed for the first time (i.e., a time measured by the count from "0" to "m").

According to this construction, after the fuse time counter 71 initiates a first forcing shutoff operation for the power MOSFET 15 and the like, the first forcing shutoff operation can be released when a holding time of some length expires, i.e., when the heat of the power MOSFET 15, the load and the like are discharged so that the conductive state may be resumed. Further, a first reference time counted for a first forcing shutoff operation to be performed for the second time or more (i.e., a time measured by the count from "k" to "m") is shorter than a first reference time counted for a first forcing shutoff operation to be performed for the first time (i.e., a time measured by the count from "0" to "m"). Thereby, in the case that the load 50 is a motor system, for example, a first shutoff operation for the power MOSFET 15 and the like is prevented from being unnecessarily performed due to a high current corresponding to high torque during the start-up.

Furthermore, according to the present embodiment, if the clear counter 72 once overflows, during a first forcing shutoff operation being performed for the nth time (e.g., the second time in the present embodiment) or more after a first forcing shutoff operation is performed for the first time, so that the count value of the fuse time counter 71 is cleared to be "k" (at a time (K) in FIG. 9) and thereafter the clear counter 72 overflows in succession (at a time (L) in FIG. 9), the count value of the fuse time counter is cleared to be "zero" on the supposition that a normal state is actually achieved.

Third Embodiment

Figure 10:
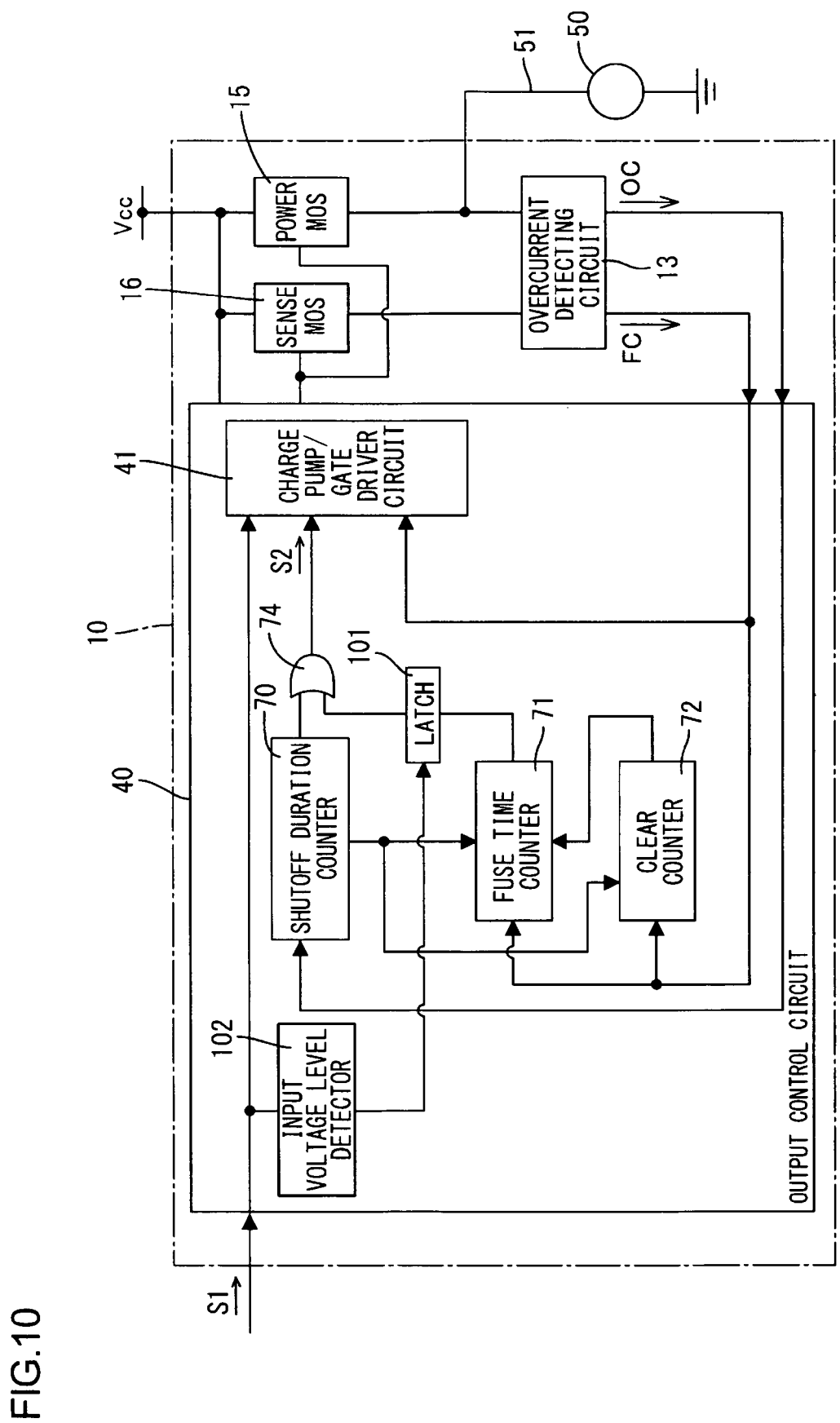
FIG. 10 is a block diagram schematically showing a power supply controller according to a third embodiment.

FIG. 10 is a block diagram schematically showing the power supply controller 10 of the above third embodiment. In the embodiment, an input voltage level detector circuit 102 for detecting a potential level at the input terminal P1 (i.e., an example of "an external input terminal") is provided for the latch circuit 101 that maintains the first forcing shutoff operation. Whether the latch function of the latch circuit 101 is validated or invalidated is selected depending on the potential level of a control signal S1 applied to the input terminal P1.

Figure 11:
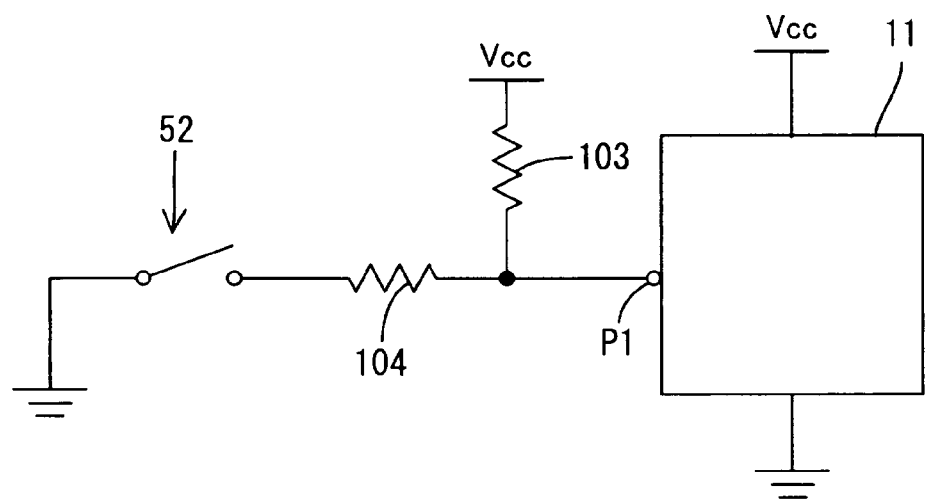
FIG. 11 is a schematic diagram showing the power supply controller and an operation switch (one example)
Figure 12:
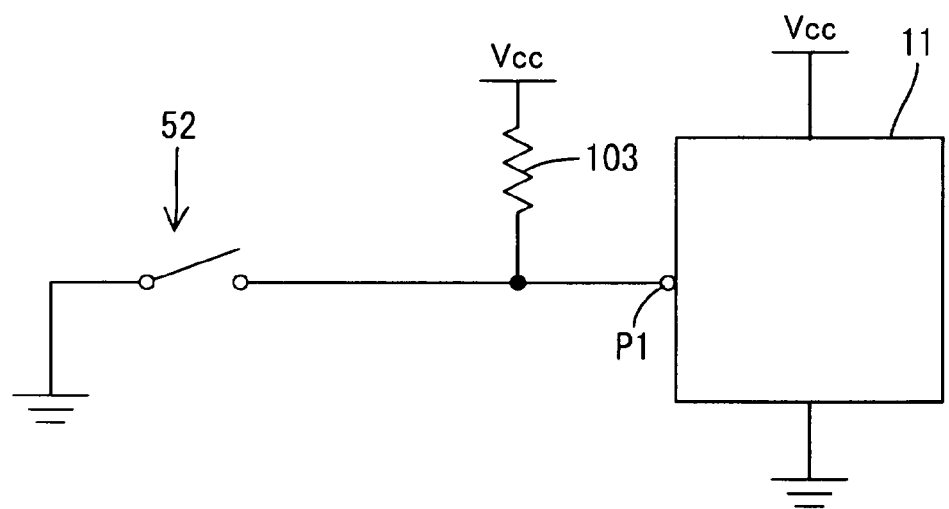
FIG. 12 is a schematic diagram showing the power supply controller and the operation switch (another example)

FIGS. 11 and 12 are schematic diagrams showing an power supply controller 10 and an operation switch 52 according to the present embodiment. In the case of a circuit construction in which a control signal S1 of a divided voltage level obtained from the power supply voltage Vcc using resistors 103 and 104 (e.g., their resistance values have 1:1 ratio) is applied to the input terminal P1 of the semiconductor device 11 when the operation switch 52 is ON as shown in FIG. 11, for example, the latch function of the latch circuit 101 is validated.

On the other hand, in the case of a circuit construction in which a control signal S1 of a low voltage level obtained from the power supply voltage Vcc by a voltage drop corresponding to a single resistor 103 is applied to the input terminal P1 of the semiconductor device 11 when the operation switch 52 is ON as shown in FIG. 12, the latch function of the latch circuit 101 is invalidated. If the latch function is invalidated, the clock signal CLK is directly applied to the clear counter 72 without the AND circuit 78 intervening, for example, so that the count-up operation of the clear counter 72 is continued after a first forcing shutoff operation is initiated. Thereby the first forcing shutoff operation can be released, when the clear counter 72 overflows after the first forcing shutoff operation is initiated.

Thus, according to the present embodiment, whether the latch circuit 101 is validated or invalidated can be readily determined by changing the potential level of a control signal S1 applied to the input terminal P1.

Fourth Embodiment

Figure 13:
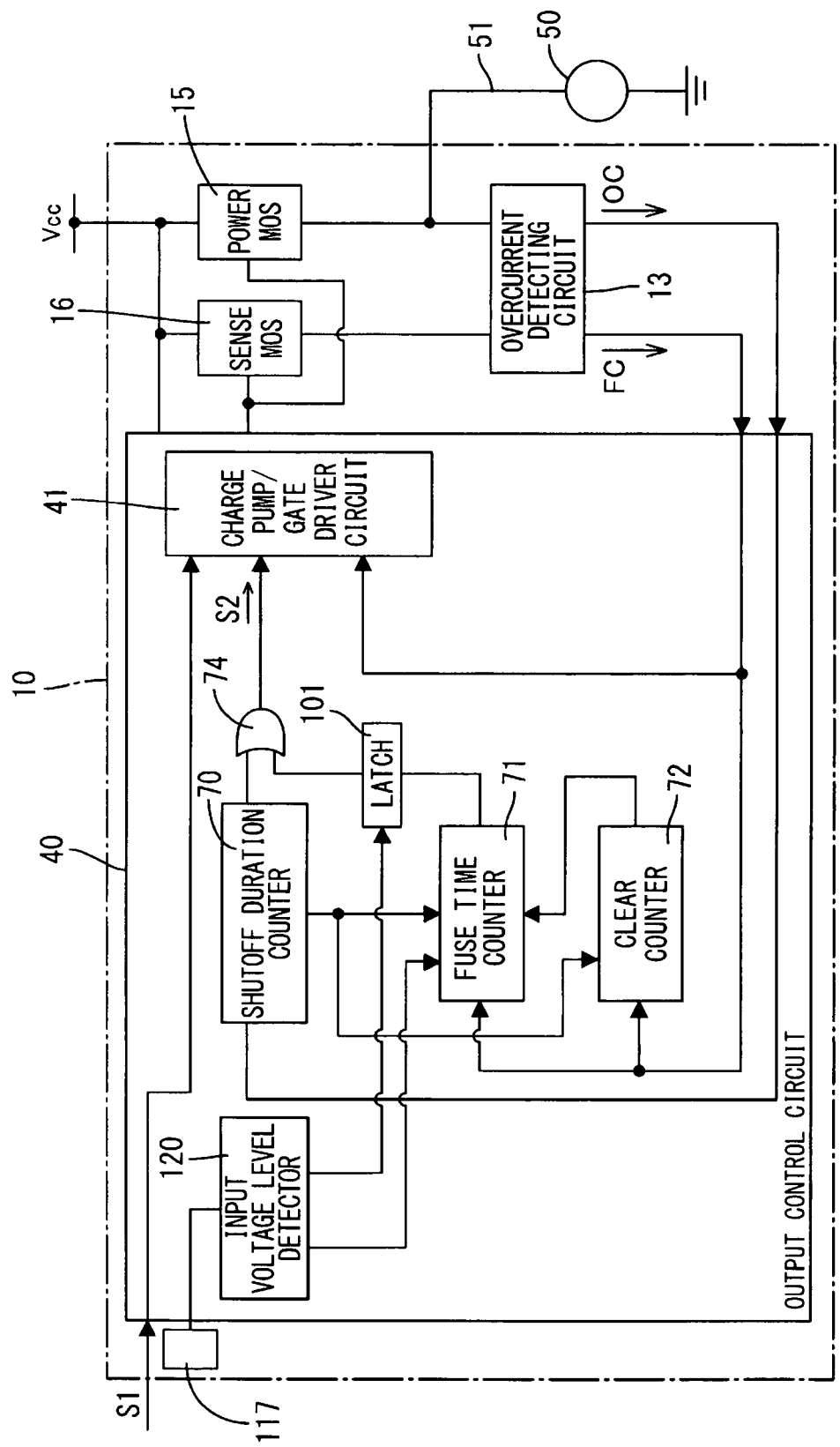
FIG. 13 is a block diagram schematically showing a power supply controller according to a fourth embodiment.
Figure 14:
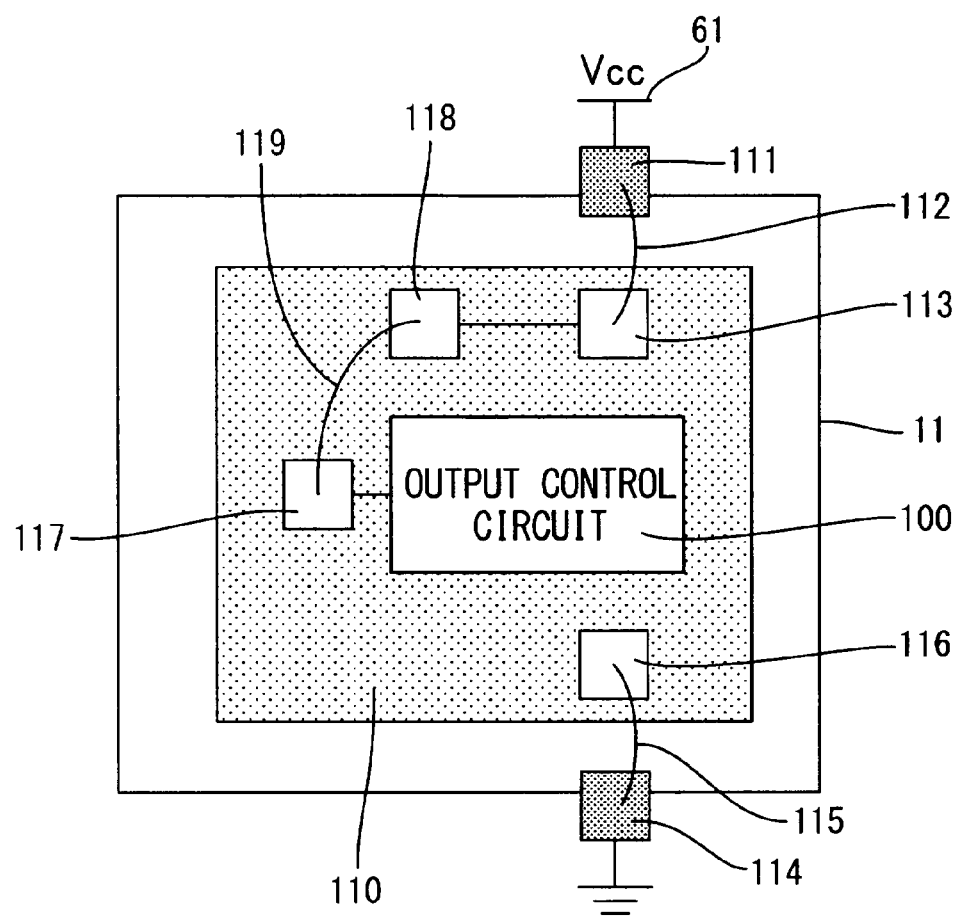
FIG. 14 is a diagram schematically showing the external construction of a semiconductor device.

Basically, FIG. 13 is a block diagram schematically showing the power supply controller 10 of the above second embodiment, and the latch circuit 101 of the first embodiment is added thereon. FIG. 14 is a diagram schematically showing the external construction of the semiconductor device 11. As shown in the figure, the output control circuit 100 and the like are mounted on a semiconductor chip 110 of the semiconductor device 11. Further a power connecting pad 113, which is electrically connected by a wire bonding 112 to the power supplying terminal 111 connected to the power source 61, and a ground connecting pad 116, which is electrically connected by a wire bonding 115 to the ground connecting terminal 114 connected to the ground, are arranged thereon.

A switching pad 117 (i.e., an example of "a bonding pad") is connected to the output control circuit 100 via a circuit pattern. Another bonding pad 118 is electrically connected to the power connecting pad 113 via a circuit pattern. The potential level of the switching pad 117 can be changed depending on whether the switching pad 117 is connected to the bonding pad 118 via a wire bonding 119 (i.e., an example of "a wire bonding") or not.

In the output control circuit 100, as shown in FIG. 13, an input voltage level detector circuit 120, connected to the latch circuit 101 and the fuse time counter 71, detects the switching pad 117. When the switching pad 117 is connected to the bonding pad 118, for example, the latch function of the latch circuit 101 is validated. On the other hand, when the switching pad 117 is not connected to the bonding pad 118, the latch function of the latch circuit 101 is invalidated, and the operation is determined so that the cleared amount of the count value of the fuse time counter 71 is decreased for a first forcing shutoff operation to be performed for the second time or more, similarly to the second embodiment.

According to the present embodiment, whether the latch function is validated or invalidated, and whether the cleared amount of the count value of the fuse time counter 71 is decreased for a first forcing shutoff operation to be performed for the second time or more can be readily determined, even after the semiconductor device 11 has been manufactured, by changing what the switching pad 117 is connected to, via the wire bonding 119.

Fifth Embodiment

A fifth embodiment of the present invention will be explained with reference to FIGS. 15 through 23. In the drawings, an overbar attached to a symbol indicating each of various signals represents that the signal is a low active signal.

1. Construction of Power Supply Controller

Figure 15:
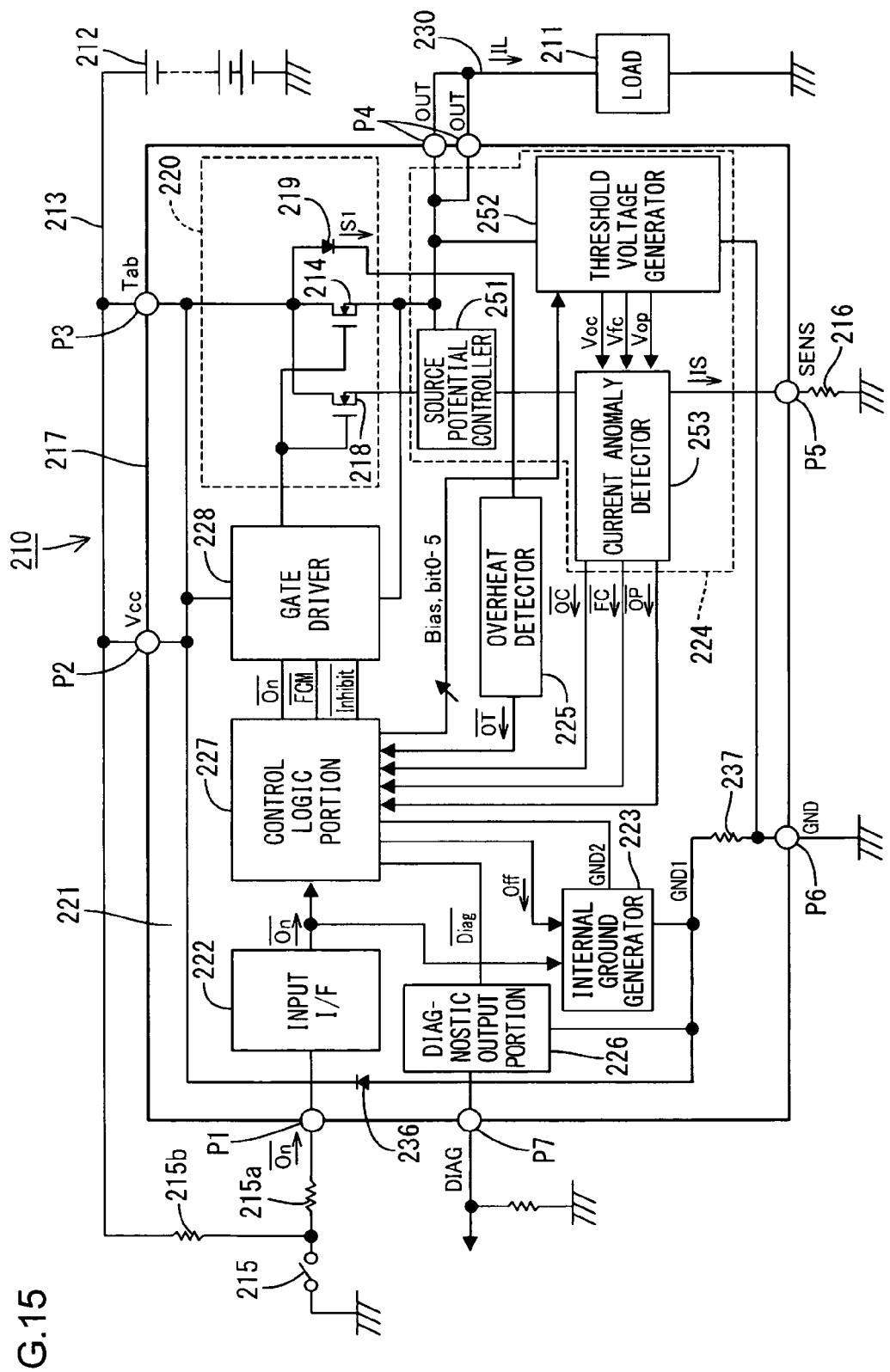
FIG. 15 is a block diagram showing the general construction of the power supply controller according to the fifth embodiment of the present invention.

FIG. 15 is a block diagram of the general construction of a power supply controller 210 according to the present embodiment. The power supply controller 210 can be installed on a vehicle not shown, and used for control of the power supply from a vehicle power source (hereinafter, referred to as "a power source 212") to a load 211 such as a defogger heater (i.e., a linear resistive load), a vehicle lamp, or a motor for a cooling fan or a wiper (i.e., an L-load (or inductive load)). Hereinafter, the "load" means a device to be controlled by the power supply controller 210, and does not include an electric wire 230 connected between the power supply controller 210 and the controlled device. The load 211 and the electric wire 230 are collectively called "an external circuit".

Specifically, the power supply controller 210 includes a power MOSFET 214 (i.e., an example of "a semiconductor switching element") as a power FET disposed on a power supply line 213 connected between the power source 212 and the load 211. In the power supply controller 210, a control signal On such as a constant voltage signal or a PWM (Pulse Width Modulation) control signal is applied to the gate of the power MOSFET 214 so as to switch the power MOSFET between ON and OFF. Thereby power supply to the load 211 connected to the output side of the power MOSFET 214 is controlled. In the present embodiment, an input terminal P1 of the power supply controller 210 is connected to an external operation switch 215, and the power supply controller operates when the operation switch 215 is ON. Specifically the input terminal P1 is connected to the operation switch 215 via a resistor 215a, and the connecting point between the operation switch 215 and the resistor 215a is connected to the power source 212 via a resistor 215b. Thus the input terminal P1 is pulled up to the power supply voltage Vcc side when the operation switch 215 is OFF.

As shown in FIG. 15, the power supply controller 210 is formed as a semiconductor device 217 (semiconducting device), on which the input terminal P1, a power supply (Vcc) terminal P2 and a tab terminal P3 to be connected to the power source 212, a load connecting terminal P4 to be connected to the load 211, an external terminal P5 to be connected to the ground (GND) via an external resistor 216 as a current-voltage converter circuit, a ground terminal P6 to be connected directly to the ground (GND), and a diagnostic output terminal P7 are provided. In the present embodiment, the power MOSFET 214, a sense MOSFET 218 (i.e., an example of "a current detecting element") as a sense FET described below and a temperature sensor 219 (e.g., a diode in the present embodiment) as a temperature detecting element are configured onto a single chip as a power chip 220, which is mounted on a control chip 221 that includes the other circuits.

Figure 17:
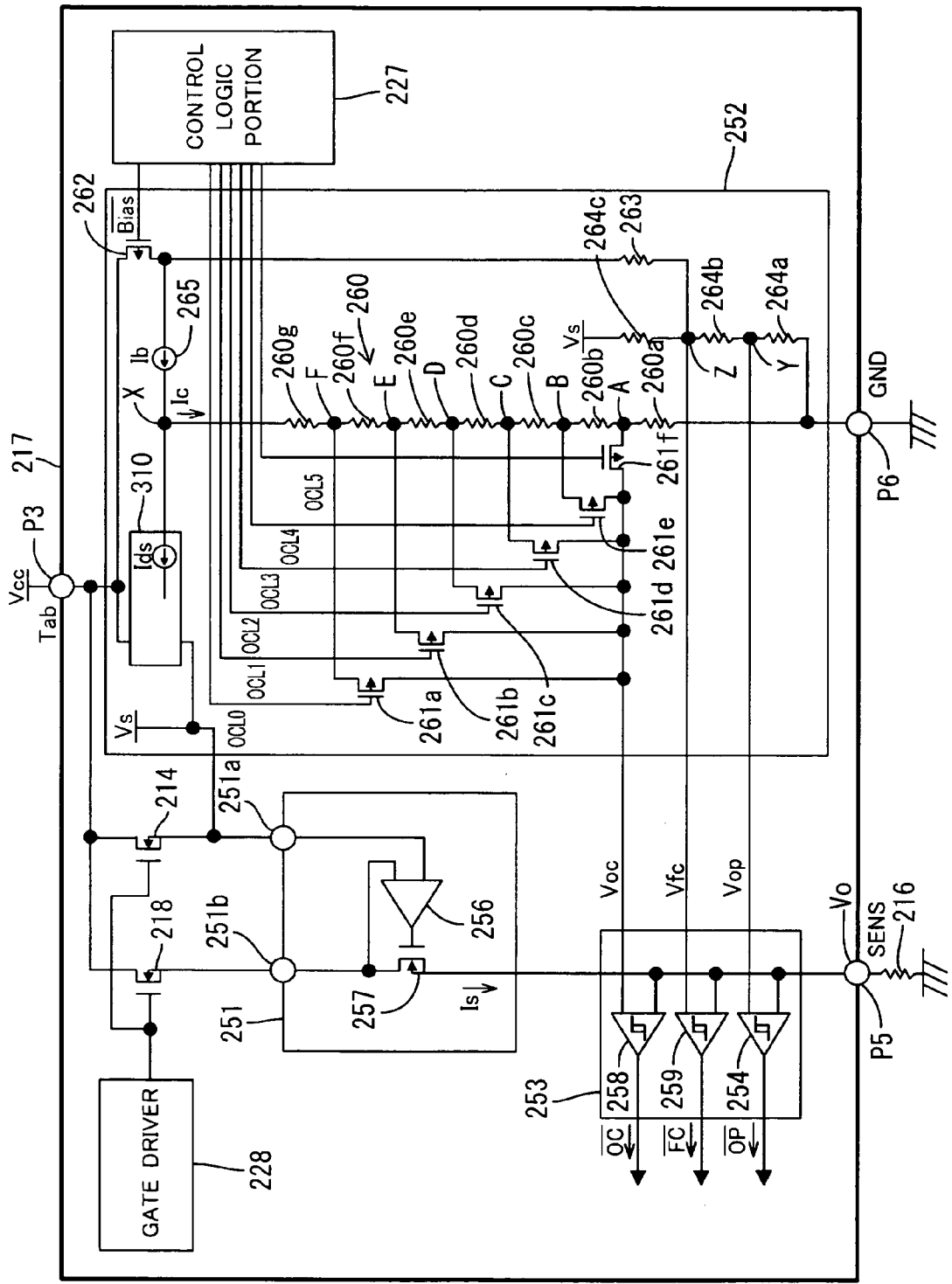
FIG. 17 is a circuit diagram of a source potential controller, a threshold voltage generator and a current anomaly detector.

A plurality of n-channel MOSFETs are arranged on the power chip 220. The drains of the MOSFETs are connected in common to one another, and further connected to the tab terminal P3. As shown in FIG. 17, the sources of most of the MOSFETs are connected in common to a power FET input 251a of a source potential controller 251 described below and the load connecting terminal P4, so that the MOSFETs form the power MOSFET 214. The sources of the rest of the MOSFETs are connected in common to a sense FET input 251b of the source potential controller 251, so that the MOSFETs form the sense MOSFET 218. The ratio of the number of MOSFETs constituting the sense MOSFET 218 to the number of MOSFETs constituting the power MOSFET 214 corresponds approximately to a sense ratio k.

The control chip 221 mainly includes an input interface 222, an internal ground generator 223, a current detector 224, an overheat detector 225, a diagnostic output portion 226, a control logic portion 227, and a gate driver 228. A diode 236, the cathode side of which is connected to the higher potential side, and a resistor 237 are serially connected between the power supply terminal P2 and the ground terminal P6 as shown in FIG. 15. The connecting point therebetween is provided as an internal ground GND1. According to this construction, if the ground terminal P6 side is connected to the power supply voltage Vcc side by mistake, a current passing into the circuits of the power supply controller 210 is suppressed because of the diode 236 so as to be equal to or lower than a predetermined level.

(Input Interface)

The input side of the input interface 222 is connected to the input terminal P1. Thereby a control signal On of high level is inputted when the operation switch 215 is OFF, while a control signal On of low level (low active) is inputted when the operation switch is ON. The control signal On is then applied to the internal ground generator 223 and the control logic portion 227. In a normal state, i.e., when neither a current anomaly nor a temperature anomaly has occurred as will be described below, the power supply controller 210 turns ON the power MOSFET 214, resulting in a conductive state, by the gate driver 228 in response to an active (i.e., low-level) control signal On. On the other hand, in response to a nonactive (i.e., high-level) control signal On, the power supply controller 210 turns OFF the power MOSFET 214 by the gate driver 228, resulting in a shutoff state. A low-level control signal On of the present embodiment corresponds to an ON signal (i.e., a load ON signal). A nonactive control signal On corresponds to an OFF signal. The gate driver 228 functions as "a switch control circuit". Further, the gate driver 228 has functions (i.e., a charge rate changing circuit and a discharge rate changing circuit) similar to the above-described charge pump/gate driver circuit 41 of the first embodiment.

(Internal Ground Generator)

The internal ground generator 223 as a constant supply-voltage generator operates when it receives an active control signal On (ON signal) from the input interface 222 or a low-level output signal Off (indicating that a clear counter 272 has not overflowed) from the control logic portion 227 described below, so as to generate an internal ground GND2 lower than the power supply voltage Vcc by a predetermined constant voltage Vb. That is, once the internal ground generator 223 starts to operate, it is maintained to the operational state so as to continue generation of the internal ground GND2 as long as a low-level output signal Off is received from the control logic portion 227 (i.e., unless the clear counter 272 overflows), even if a nonactive control signal On (OFF signal) is received from the input interface 222. Thus the constant voltage Vb, corresponding to the difference determined by subtracting the internal ground GND2 from the power supply voltage Vcc, is provided for the control logic portion 227, and thereby the control logic portion 227 can operate.

Figure 16:
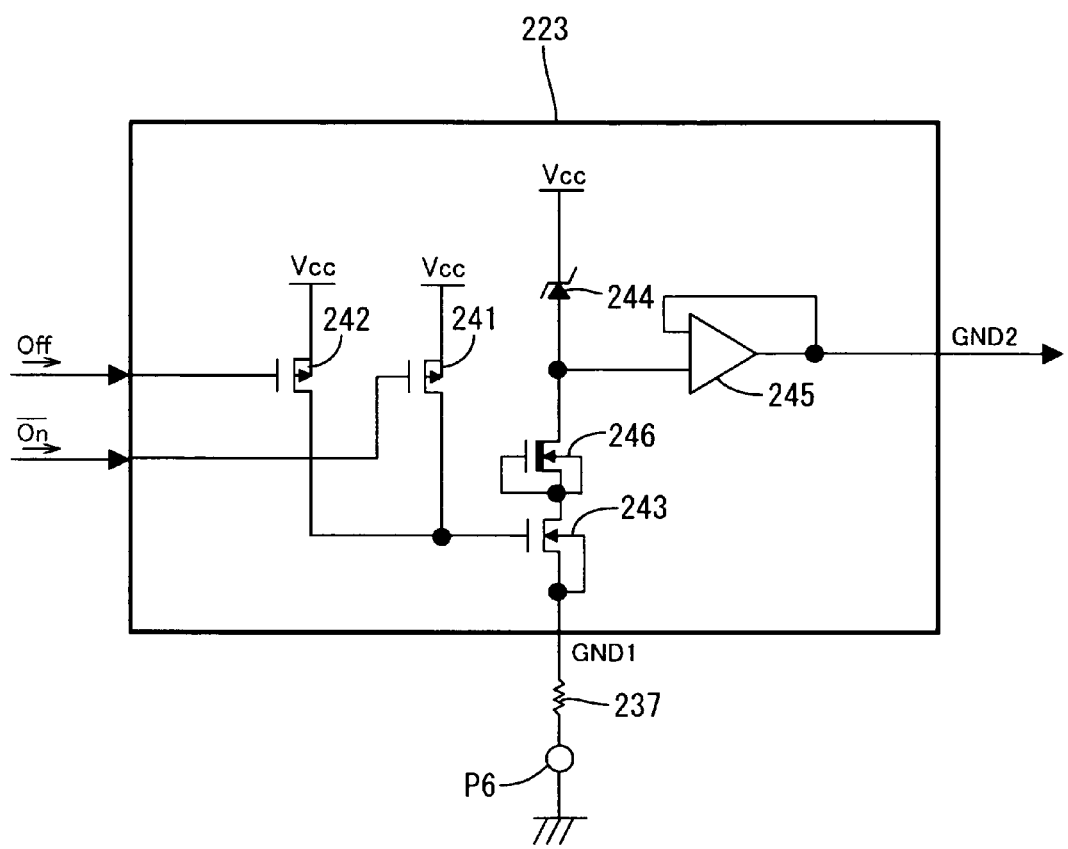
FIG. 16 is a circuit diagram of an internal ground generator.

Specifically, as shown in FIG. 16, the internal ground generator 223 includes an FET 241 as a switching element to be turned on in response to an active control signal On, and an FET 242 as a switching element to be turned on in response to a low-level output signal Off. The output sides of the FETs 241, 242 are both connected to the control terminal of an FET 243 as a switching element. The input side (i.e., the drain side) of the FET 243 is connected to the power supply terminal P2 via a Zener Diode 244, while the output side (i.e., the source side) thereof is connected to the ground terminal P6 via the above resistor 237.

In the internal ground generator 223, the FET 243 is turned on in response to an active control signal On or a low-level output signal Off. Thereby the internal ground generator operates so as to generate the internal ground GND2, which is lower than the power supply voltage Vcc by a voltage corresponding to the Zener voltage of the Zener diode 244. The generated internal ground is provided for the control logic portion 227, via an operational amplifier 245 as a voltage follower. In the present embodiment, an FET 246, in which short connection between the source and gate (i.e., diode connection) is formed, is disposed on a power supply line connected between the Zener diode 244 and the FET 243. Thereby a constant current passes through the Zener diode 244 when the FET 243 is on, and consequently a more stable internal ground GND2 can be generated.

(Current Detector)

The current detector 224 includes a source potential controller 251, a threshold voltage generator 252, and a current anomaly detector 253 as shown in FIG. 15. FIG. 17 is a circuit diagram mainly showing the source potential controller 251, the threshold voltage generator 252 and the current anomaly detector 253, and the rest of the circuit construction is partly omitted.

a. Source Potential Controller

The source potential controller 251 is provided for maintaining the output-side potentials (i.e., the source potentials) of the power MOSFET 214 and the sense MOSFET 218 to be equal to each other.

The source potential controller 251 includes an operational amplifier 256 and an FET 257 as a switching element. The pair of input terminals of the operational amplifier 256 are connected to the power FET input 251a (i.e., to the source of the power MOSFET 214) and the sense FET input 251b (i.e., to the source of the sense MOSFET 218), respectively. The FET 257 is connected between the sense FET input 251b and the external terminal P5, and the output of the operational amplifier 256 is applied to the control terminal thereof. More specifically, the negative input of the operational amplifier 256 is connected to the power FET input 251a, while the positive input of the operational amplifier 256 is connected to the sense FET input 251b. The differential output of the operational amplifier 256 is fed back to the positive input through between the gate and drain of the FET 257.

The operational amplifier 256 is maintained in an imaginary short state due to the feedback of the differential output of the operational amplifier 256, that is, the potentials of the positive input and negative input are maintained almost equal to each other. Thereby the potentials of the drains of the power MOSFET 214 and the sense MOSFET 218 are maintained equal to each other, and the potentials of the sources thereof are also maintained equal to each other. Consequently, a sense current Is (i.e., an example of "a detection signal") passing through the sense MOSFET 218 can be stably maintained to a constant ratio (i.e., the sense ratio k) to a load current IL passing through the power MOSFET 214. The sense current Is from the source potential controller 251 passes into the external resistor 216 via the external terminal P5, and therefore the terminal voltage Vo of the external terminal P5 varies with the sense current Is.

b. Current Anomaly Detector

The current anomaly detector 253 includes one comparator or a plurality (e.g., three in the present embodiment) of comparators 254, 258, 259 (e.g., hysteresis comparators in the present embodiment). The terminal voltage Vo of the external terminal P5 is applied to one input of each comparator 254, 258, 259.

The comparator 258 (i.e., an example of "a second abnormal current detecting circuit") receives a first anomaly threshold voltage Voc on the other input thereof from the threshold voltage generator 252, and outputs an overcurrent signal OC of low level (i.e., a low active signal, and an example of "a second abnormal current signal") to the control logic portion 227 when the terminal voltage Vo exceeds the first anomaly threshold voltage Voc. Hereinafter, a load current IL, passing through the power MOSFET 214 when the terminal voltage Vo reaches the first anomaly threshold voltage Voc, i.e., during a current anomaly, is called "a first anomaly threshold current ILoc" (i.e., an example of "a second threshold"), and this current anomaly is called "an overcurrent".

The comparator 259 (i.e., an example of "a first abnormal current detecting circuit") receives a second anomaly threshold voltage Vfc (<Voc) on the other input thereof from the threshold voltage generator 252, and outputs a fuse current signal FC of low level (i.e., a low active signal, and an example of "a first abnormal current signal") to the control logic portion 227 when the terminal voltage Vo exceeds the second anomaly threshold voltage Vfc. Hereinafter, a load current IL, passing through the power MOSFET 214 when the terminal voltage Vo reaches the second anomaly threshold voltage Vfc, i.e., during a current anomaly, is called "a second anomaly threshold current ILfc" (i.e., an example of "a first threshold"), and this current anomaly is called "a fuse current".

The comparator 254 receives a third anomaly threshold voltage Vop on the other input thereof from the threshold voltage generator 252, and outputs a breaking indication signal OP of low level (low active) to the control logic portion 227 when the terminal voltage Vo is lower than the third anomaly threshold voltage Vop. Hereinafter, a load current IL, passing through the power MOSFET 214 when the terminal voltage Vo reaches the third anomaly threshold voltage Vop, is called "a third anomaly threshold current ILop", and this anomaly is called "a wire-breaking anomaly".

c. Threshold Voltage Generator

As shown in FIG. 17, the threshold voltage generator 252 mainly includes a current output circuit 310, which outputs a current Ic indicating the difference determined by subtracting a current Ids (<Ib) corresponding to the drain-to-source voltage Vds of the power MOSFET 214 (i.e., an input-to-output voltage of a semiconductor switching element) from a current Ib corresponding to a predetermined constant voltage, and further includes a threshold setting resistor 260, through which the output current Ic from the current output circuit 310 passes.

Specifically, the current output circuit 310 is connected between the drain and source of the power MOSFET 214, and thereby causes a current Ids corresponding to the drain-to-source voltage Vds thereof to pass into the ground terminal P6. Further, an FET 262, which turns on in response to a bias signal Bias as described below, and a constant current circuit 265, which causes the current Ib, are connected between the input terminal, provided on the current output circuit 310 for receiving the current Ids, and the power supply terminal P2. A plurality of threshold setting resistors (e.g., seven threshold setting resistors 260a-260g in the present embodiment) are serially connected between the connecting point X, between the above input terminal and the constant current circuit 265, and the ground terminal P6, so that the above third current Ic passes through the threshold setting resistors 260a-260g. Divided voltages at the respective connecting points A-F between the threshold setting resistors 260a-260g vary in proportion to the third current Ic (=Ib−Ids), i.e., in proportion to a voltage corresponding to the difference determined by subtracting the drain-to-source voltage Vds of the power MOSFET 214 from the constant voltage. According to this construction, the first anomaly threshold current ILoc decreases with increase of the drain-to-source voltage Vds of the power MOSFET 214, and increases with decrease.

Therefore, if short-circuiting in the load 211 occurs immediately after turn-on of the power MOSFET 214, the first anomaly threshold current ILoc is then set to a relatively low level because the drain-to-source voltage Vds is relatively high. Consequently, the load current IL can reach the first anomaly threshold current ILoc early without reaching a high level, i.e., when it is relatively low level, and thereby the current detector 224 can output an active signal OC early. Further, in case that the power supply voltage Vcc decreases, for example, the first anomaly threshold current ILoc is maintained substantially equal to the level before the decrease of the power supply voltage Vcc. This is because, even if the power supply voltage Vcc decreases, the drain-to-source voltage Vds is almost maintained as long as the power MOSFET 214 is ON. Therefore the power supply operation of the power MOSFET 214 can be sufficiently achieved in this case.

The threshold voltage generator 252 further includes a plurality of FETs 261a-261f as switching elements for connecting the other input terminal of the comparator 258 selectively to the connecting points A-F between the threshold setting resistors 260a-260g. Thereby the first anomaly threshold voltage Voc can be decreased stepwise by turning on the FETs 261a-261f selectively and sequentially. The ON-OFF switching of the FETs 261a-261f is controlled by the control logic portion 227 as described below.

On the other hand, the second and third anomaly threshold voltages Vfc and Vop vary with the source voltage Vs (i.e., an output side voltage of a semiconductor switching element) of the power MOSFET 214. Specifically, a plurality of voltage-dividing resistors (e.g., three threshold setting resistors 264a-264c in the present embodiment) are serially connected between the source of the power MOSFET 214 and the ground terminal P6. The divided voltage at the connecting point Y between the threshold setting resistors 264a and 264b is outputted as the third anomaly threshold voltage Vop, while the divided voltage at the connecting point Z between the threshold setting resistors 264b and 264c is outputted as the second anomaly threshold voltage Vfc.

Therefore, in case that a fuse current occurs immediately after turn-on of the power MOSFET 214, the second anomaly threshold current ILfc is then set to a relatively low level because the drain-to-source voltage Vds is relatively high. Consequently, the load current IL can reach the second anomaly threshold current ILfc early without reaching a high level, i.e., when it is relatively low level, and thereby the current detector 224 can output an active fuse current signal FC early.

Figure 19:
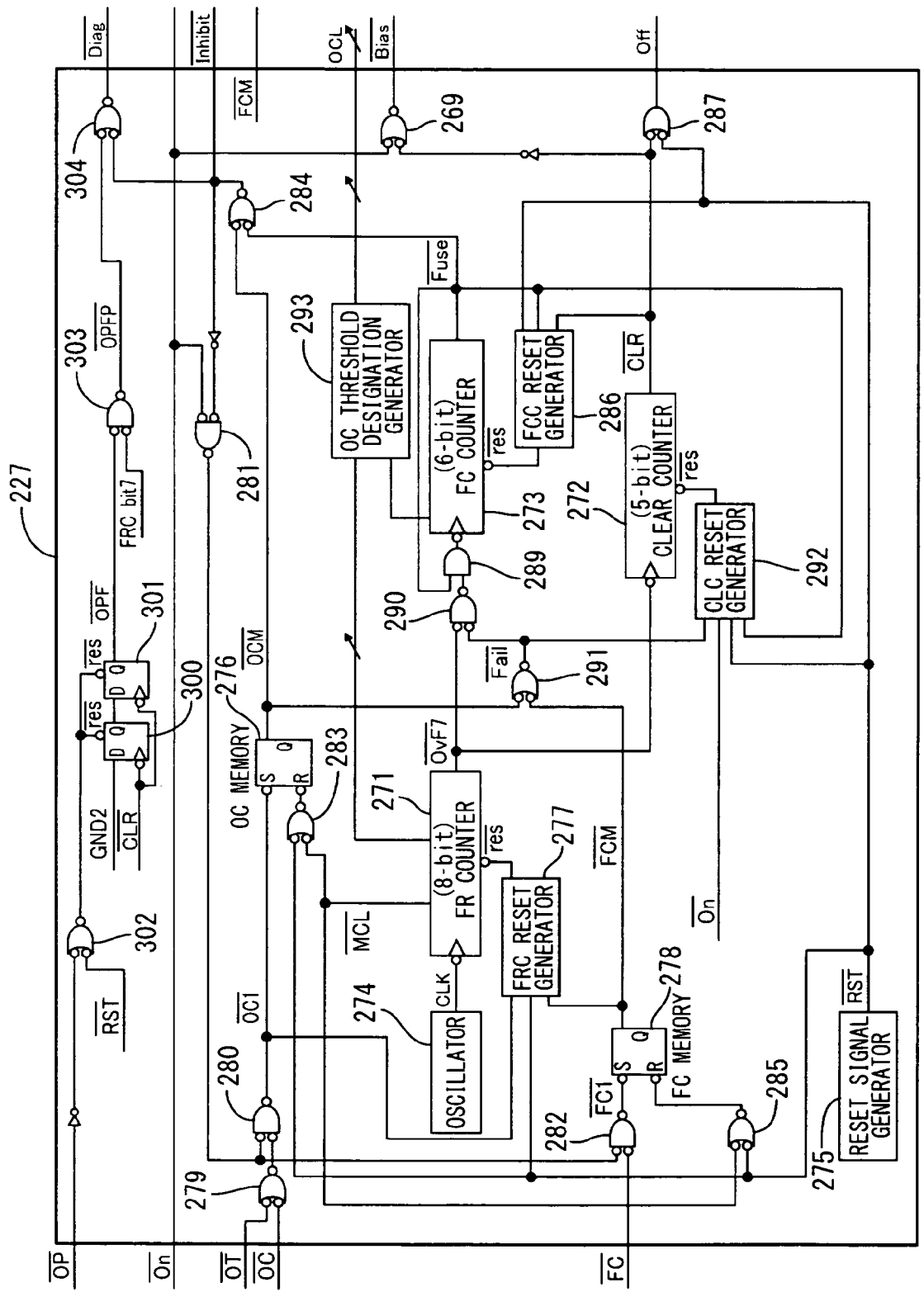
FIG. 19 is a circuit diagram of a control logic portion.

In the present embodiment, the FET 262, which is a switching element that turns on in response to a low-level (low active) bias signal Bias from the control logic portion 227, and a resistor 263 are provided between the power supply terminal P2 and the connecting point Z, and thereby the second and third anomaly threshold currents ILfc and ILop are biased so as not to decrease to a negative level with variation of the load resistance of the load 211. When the FET 262 turns on, a current passes through the resistor 263 and thereby the second and third anomaly threshold voltages Vfc and Vop are pulled up to the power supply voltage Vcc side by a voltage corresponding to a voltage drop on the resistor 263. The low-level bias signal Bias is outputted from the control logic portion 227 for turning on the FET 262, when the control signal On is active or the clear signal CLR is nonactive. Specifically, as described below, a NOR circuit 269, to which a level-inverted signal of the control signal On and a clear signal CLR from the clear counter 272 are inputted, is provided in the control logic portion 227 as shown in FIG. 19, and the NOR circuit 269 can output a low-level (low active) bias signal Bias. On the other hand, the first anomaly threshold current ILoc can be biased by designing so that 'Ib−Ids>0' is satisfied. Thus the second current Ib can function as a bias.

Figure 18:
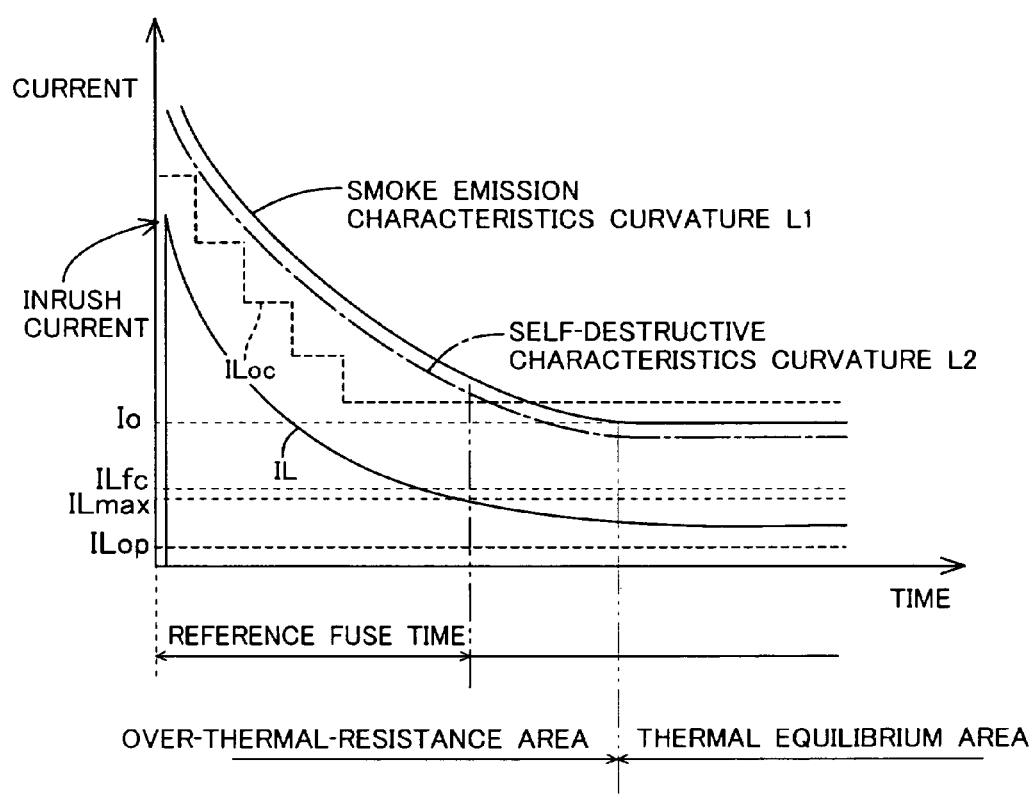
FIG. 18 is a graph for explanation of setup levels of a first anomaly threshold current and a second anomaly threshold current.

FIG. 18 is a graph for explanation of setup levels of the first, second and third anomaly threshold currents ILoc, ILfc, and ILop. The graph relates to the smoke emission characteristics of an electric wire 230 (e.g., a coating material of the electric wire) connectable to the power supply controller 210, in which the smoke emission characteristics curvature L1 representing the relation between a constant current level and a current-applying time (i.e., a time taken for fusing) is shown. That is, the smoke emission characteristics curvature L1 represents the relation between an arbitrary constant current (one-shot current) and a time taken for the coating material of the electric wire 230 to begin to burn while the constant current is applied to the electric wire 230. In the graph, a self-destructive characteristics curvature L2 is also shown, which represents the relation between an arbitrary constant current (one-shot current) and a time taken for the power MOSFET 214 to break while the constant current is applied to the MOSFET 214. The second anomaly threshold current ILfc is set to a value within the area where a current level is lower than the smoke emission characteristics curvature L1 and the self-destructive characteristics curvature L2. The first anomaly threshold current ILoc is set to a value within the area where a current level is lower than the smoke emission characteristics curvature L1 and the self-destructive characteristics curvature L2, for a time domain corresponding to a reference FUSE time described below beginning with start of count from the initial value by a fuse counter 273.

Note that the smoke emission characteristics shown in the graph relates to an electric wire 230 selected from electric wires 230 likely connected to the power supply controller 210. The smoke emission characteristics depends on an external circuit (e.g., a wiring member such as an electric wire, or a load) to be connected to the power supply controller 210.

Therefore values of the load current IL and the sense current Is, based on which active signals FC, OC are outputted, should be also changed depending thereon. However, that can be readily achieved by adjusting the resistance of the above-described external resistor 216.

In the graph, ILmax represents the rated current of the load 211 (i.e., a limit of use against which the design thereof is guaranteed). Io represents the equilibrium critical current that can be applied while maintaining a thermal equilibrium state in which heat generation and radiation in the electric wire 230 are balanced. If a current of a higher level than the equilibrium critical current Io is applied, that relates to the over-thermal-resistance area in which a current level and a time taken for burn are substantially in inverse proportion to each other. The second anomaly threshold current ILfc is set to a value slightly higher than the rated current ILmax of the load 211 as shown in FIG. 18. The comparator 259 detects a fuse current when the load current IL reaches the second anomaly threshold current ILfc, and outputs an active fuse current signal FC. If the load current IL is around the second anomaly threshold current ILfc, the power MOSFET 214 does not need to be turned OFF immediately. It should be turned OFF, only if the fuse current state continues for a considerable time as described below.

The third anomaly threshold current ILop is set to a further lower level than the rated current ILmax. The comparator 254 detects a wire-breaking anomaly when the load current IL reaches the third anomaly threshold current ILop, and outputs an active breaking indication signal OP.

In contrast, the first anomaly threshold current ILoc is set to a level higher than the second anomaly threshold current ILfc. The comparator 258 detects an overcurrent when the load current IL reaches the first anomaly threshold current ILoc, and outputs an active overcurrent signal OC. When the load current IL is thus high level beyond the first anomaly threshold current ILoc, the power MOSFET 214 should be turned OFF immediately as described below. In preparation for an inrush current, the threshold voltage generator 252 first sets the first anomaly threshold current ILoc to an initial level higher than the inrush current as shown in FIG. 18. Thereafter, if a fuse current is detected, for example, the first anomaly threshold current ILoc is decreased stepwise with time as described below.

(Overheat Detector)

The overheat detector 225 receives a temperature signal S1 corresponding to a temperature of the power chip 220 from the temperature sensor 219 provided on the power chip 220. The overheat detector 225 detects a temperature anomaly when the received temperature signal S1 exceeds a predetermined threshold temperature, and provides a low-level (low active) temperature anomaly signal OT to the control logic portion 227.

(Control Logic Portion)

FIG. 19 is a circuit diagram of the control logic portion 227. The control logic portion 227 mainly includes an FR counter (i.e., a free-running counter and an example of "a free-running counter circuit") 271, the clear counter 272, the fuse counter (FC counter) 273, an oscillator 274, a reset signal generator 275 and the like. The control logic portion 227 receives the control signal On from the input interface 222, the signals OC, FC, OP from the current detector 224, and the temperature anomaly signal OT from the overheat detector 225 as described above.

a. Oscillator and Reset Signal Generator

The oscillator 274 generates and outputs a clock signal CLK (in 125 microsecond period, for example). The reset signal generator 275 generates a constant voltage sufficient for the internal ground generator 223 and the present control logic portion 227 to operate. Further it outputs a reset signal RST of low level (low active), unless and until clock generation of the oscillator 274 is stabilized. After the clock generation is stabilized, a reset signal RST of high level is outputted.

b. Overcurrent Protective Circuit

If at least one of an active overcurrent signal OC from the current detector 224 and an active temperature anomaly signal OT from the overheat detector 225 is received, the overcurrent protective circuit (i.e., an example of "a shutoff duration accumulator circuit") mainly performs a forcing shutoff operation of the power MOSFET 214 for a predetermined third reference time, and thereafter releases the forcing shutoff state. Specifically, the overcurrent protective circuit includes the FR counter 271, an OC memory 276, an FRC reset generator 277, an FC memory 278 and the like. In the present embodiment, "forcing shutoff" means that the power MOSFET 214 is forcibly turned OFF although the power supply controller 210 is receiving an active control signal On (ON signal).

The control logic portion 227 includes a NOR circuit 279, which receives the level-inverted signals of the signals OC, OT, and further includes a NAND circuit 280, which receives the level-inverted signal of an output signal from the NOR circuit 279. The level-inverted signal of a set signal OC1 from the NAND circuit 280 is inputted to the set terminal of the OC memory 276 (i.e., an RS flip-flop). The level-inverted signal of an output signal of a NAND circuit 281 is also inputted to the NAND circuit 280. The level-inverted signal of a control signal On and a forcing shutoff signal Inhibit (which is low level when forcing shutoff of the power MOSFET 214 should be performed) described below are inputted to the NAND circuit 281.

According to this construction, while an active control signal On is inputted, the NAND circuit 280 outputs a set signal OC1 of low level (low active), if at least one of an active overcurrent signal OC from the current detector 224 and an active temperature anomaly signal OT from the overheat detector 225 is inputted to the control logic portion 227 and the forcing shutoff signal Inhibit is high level. That is, while an ON signal is inputted, the NAND circuit 280 outputs an active set signal OC1 so that the OC memory 276 is turned to the set state, if an overcurrent or a temperature anomaly is detected and the power MOSFET 214 is not in the forcing shutoff state.

The control logic portion 227 further includes a NAND circuit 282, to which the level-inverted signal of an output signal of the NAND circuit 281 and the level-inverted signal of a fuse current signal FC are inputted. The level-inverted signal of a (low active) set signal FC1 from the NAND circuit 282 is inputted to the set terminal of the FC memory 278 (i.e., an RS flip-flop). According to this construction, while a low-level control signal On is inputted, the NAND circuit 282 outputs a set signal FC1 of low level (low active), if an active fuse current signal FC from the current detector 224 is inputted to the control logic portion 227 and the forcing shutoff signal Inhibit is high level. That is, while an ON signal is inputted, the NAND circuit 282 outputs an active set signal FC1 so that the FC memory 278 is turned to the set state, if a fuse current is detected and the power MOSFET 214 is not in the forcing shutoff state.

The FR counter 271 normally counts a predetermined time repeatedly, and is reset to "1" (i.e., the least significant bit is set to "1" and the other bits are set to "0") when any of the following reset conditions 1-3 is satisfied. In the present embodiment, the FR counter 271 is an 8-bit free-running counter, for example, and increments its count value one by one at times corresponding to down edges of the clock signal CLK from the oscillator 274 (i.e., in 125 microsecond periods). The FR counter overflows every 32 milliseconds, unless it is reset.

Reset Condition 1: The reset signal generator 275 outputs an active reset signal RST;

Reset Condition 2: The NAND circuit 280 outputs an active set signal OC1 (i.e., an overcurrent or a temperature anomaly is detected, and the power MOSFET 214 is not in the forcing shutoff state); and Reset Condition 3: The output signal FCM of the FC memory 278 is turned from high level to low level (i.e., the FRC reset generator 277 detects a down edge of the output signal FCM, or a fuse current is detected when the power MOSFET 214 is not in the forcing shutoff state).

When any of the above reset conditions 1-3 is satisfied, the FRC reset generator 277 outputs a reset signal res of low level (low active) so that the FR counter 271 is temporarily turned to the reset state. The FR counter 271 outputs a count signal OvF7 of low level (i.e., a low active signal, and an example of "a count-up signal"), when the seven lower bits of the FR counter 271 overflow (i.e., all the bits are "1"). Further it outputs a shutoff release signal MCL of low level (low active), when all the seven lower bits are "0". That is, the FR counter 271 outputs an active count signal OvF7 at a predetermined time interval (e.g., at a 16-millisecond interval), unless it is reset. Further it outputs an active shutoff release signal MCL at the above predetermined time interval, or more specifically, a predetermined time (one count in the present embodiment) later than the output of a count signal OvF7.

The level-inverted signal of an output signal from a NOR circuit 283 is inputted to the reset terminal of the OC memory 276 (i.e., an example of "a shutoff circuit"). The level-inverted signal of a reset signal RST from the reset signal generator 275 and the level-inverted signal of a shutoff release signal MCL from the FR counter 271 are inputted to the NOR circuit 283. According to this construction, the OC memory 276 turns to the set state in response to an active set signal OC1 as described above, so as to output a second forcing shutoff signal OCM of low level (low active). It outputs a second forcing shutoff signal OCM of high level, when the reset signal RST or the shutoff release signal MCL is active.

A NOR circuit 284 receives the level-inverted signal of a second forcing shutoff signal OCM and the level-inverted signal of a first forcing shutoff signal Fuse from the fuse counter 273 described below, and it outputs a forcing shutoff signal Inhibit of low level (low active) when the second forcing shutoff signal OCM or the first forcing shutoff signal Fuse is active.

According to this construction, the overcurrent protective circuit outputs an active second forcing shutoff signal OCM from the OC memory 276 when the overcurrent signal OC or the temperature anomaly signal OT is active, so that forcing shutoff of the power MOSFET 214 is performed immediately. At the same time, the FR counter 271 is reset to restart the count, and thereafter, i.e., 16 milliseconds (i.e., an example of "a third reference time") later, it outputs an active shutoff release signal MCL so that the OC memory 276 outputs a high-level second forcing shutoff signal OCM and thereby the forcing shutoff (second forcing shutoff) state of the power MOSFET 214 is released. The power MOSFET 214 can be thus restored to the conductive state as long as the power supply controller 210 receives an active control signal On. Such forcing shutoff (i.e., an example of "second shutoff"), which is immediately performed for the power MOSFET 214 by the overcurrent protective circuit and the conductive state is restored a predetermined third reference time later, is hereinafter referred to as "second forcing shutoff".

The level-inverted signal of an output signal from a NOR circuit 285 is inputted to the reset terminal of the FC memory 278. The level-inverted signal of a reset signal RST from the reset signal generator 275 and the level-inverted signal of a shutoff release signal MCL from the FR counter 271 are inputted to the NOR circuit 285. According to this construction, the FC memory 278 turns to the set state in response to an active set signal FC1 as described above, so as to output an output signal FCM of low level (low active). Further it outputs an output signal FCM of high level, when the reset signal RST or the shutoff release signal MCL is active. The FC memory 278 continues to output an active output signal FCM as long as the set signal FC1 is active, even if the reset signal RST is active.

c. Fuse Anomaly Protective Circuit

A fuse anomaly protective circuit (i.e., an example of "an anomaly time accumulator circuit") mainly accumulates an anomaly time (hereinafter referred to as "a FUSE time") during which an active fuse current signal FC is received from the current detector 224 or second forcing shutoff of the power MOSFET 214 is performed by the overcurrent protective circuit. The fuse anomaly protective circuit causes a forcing shutoff operation for the power MOSFET 214, if the accumulated time reaches a predetermined reference FUSE time (i.e., an example of "a first reference time", and longer than the third reference time). Hereinafter, such forcing shutoff (i.e., an example of "first shutoff") caused by the fuse anomaly protective circuit is referred to as "first forcing shutoff". Specifically, the fuse anomaly protective circuit includes the fuse counter 273, an FCC reset generator 286 and the like.

The fuse counter 273 (i.e., an example of "a fuse counter circuit") is a 6-bit counter, for example, and increments its count value one by one at times corresponding to down edges of the count signal OvF7 from the FR counter 271, for example. Unless the fuse counter is reset, it overflows when 1024 milliseconds are reached, and outputs a first forcing shutoff signal Fuse of low level (low active). The count value of the fuse counter 273 when it overflows is an example of "a reference anomaly count value". More specifically, the level-inverted signal of an output signal of an AND circuit 289 is inputted to the clock input terminal of the fuse counter 273. The first forcing shutoff signal Fuse from the fuse counter 273 and an output signal from a NAND circuit 290 are inputted to the AND circuit 289. The level-inverted signal of a count signal OvF7 from the FR counter 271 and the level-inverted signal of an anomaly notification signal Fail from a NOR circuit 291 are inputted to the NAND circuit 290.

The level-inverted signal of a second forcing shutoff signal OCM and the level-inverted signal of an output signal. FCM are inputted to the NOR circuit 291, which outputs an anomaly notification signal Fail of low level (low active) when the second forcing shutoff signal OCM or the output signal FCM is active. That is, the NOR circuit 291 is provided for notifying the fuse counter 273 or a CLC reset generator 292 described below that second forcing shutoff is being performed due to an overcurrent or a temperature anomaly, or that a fuse current has occurred (i.e., first forcing shutoff could be performed later).

When the anomaly notification signal Fail is active, the fuse counter 273 increments its count value one by one at times corresponding to down edges of the count signal OvF7 as long as the first forcing shutoff signal Fuse is nonactive (i.e., unless and until it overflows). When the counter overflows, it outputs an active first forcing shutoff signal Fuse so that a forcing shutoff operation for the power MOSFET 214 is performed. At the same time, the count operation according to the count signal OvF7 terminates, and the forcing shutoff state is maintained (This is first forcing shutoff).

On the other hand, the FCC reset generator 286 (i.e., an example of "an anomaly time clear circuit") resets the count value of the fuse counter 273 to "0", when the following reset condition 4 or 5 is satisfied.

Reset Condition 4: The reset signal generator 275 outputs an active reset signal RST; and Reset Condition 5: The first forcing shutoff signal Fuse is nonactive (i.e., high level) and the clear signal CLR is active (i.e., the clear counter 272 has overflowed).

An OC threshold designation generator 293 obtains the count values of the fuse counter 273 and the FR counter 271, and sequentially outputs threshold designation signals OCL0-OCL5 of low level (low active) based on the count value of the higher 5 bits of the FR counter 271 (i.e., the time counted by the FR counter 271) as shown in FIG. 20. Thereby the FETs 261*a*-261*f* of the threshold voltage generator 252 are turned on selectively and sequentially, so that the first anomaly threshold voltage Voc (and also the first anomaly threshold current ILoc) are decreased stepwise with time, i.e., according to the counted time. When the count value of the fuse counter 273 is equal to or larger than eight, the OC threshold designation generator 293 invariably outputs an active threshold designation signal OCL5, so that the first anomaly threshold voltage Voc (and also the first anomaly threshold current ILoc) are maintained to the lowest level.

d. Clear Counter

If a normal state, in which neither a current anomaly nor a temperature anomaly is detected (i.e., the load current IL is a normal level lower than the second anomaly threshold current ILfc and the first anomaly threshold current ILoc), continues for a predetermined second reference time without overflow being reached after the fuse counter 273 starts the count, the clear counter 272 as a normal duration accumulator circuit mainly outputs a clear signal CLR of low level (low active) so that the FUSE time (i.e., count value) of the fuse counter 273 is reset to the initial value "0". The second reference time is determined based on the time taken for elimination of the overheat state of an external circuit after elimination of a fuse current or overcurrent state, for example. The count value of the clear counter 272 when a normal state continues for the second reference time is an example of "a reference clear count value".

Specifically, the clear counter 272 is a 5-bit counter, for example, and increments its count value one by one at times corresponding to down edges of the count signal OvF7 from the FR counter 271, for example. Unless the clear counter is reset, it overflows and outputs an active clear signal CLR, when 512 milliseconds (i.e., an example of a second reference time) are reached. The CLC reset generator 292 (i.e., an example of "a normal duration reset circuit") resets the count value of the clear counter 272 to "0", when any of the following reset conditions 6-8 is satisfied.

Reset Condition 6: The reset signal generator 275 outputs an active reset signal RST;

Reset Condition 7: The first forcing shutoff signal Fuse is nonactive (i.e., first forcing shutoff has not been performed yet) and the anomaly notification signal Fail is active; and Reset Condition 8: The first forcing shutoff signal Fuse is active (i.e., first forcing shutoff is being performed) and the control signal On is active.

The control logic portion 227 further includes an OR circuit 287 for outputting the output signal Off, to which the level-inverted signal of a clear signal CLR and the level-inverted signal of a reset signal RST are inputted. The OR circuit 287 outputs an output signal Off of high level so that the internal ground generator 223 terminates its operation, when the clear signal CLR or the reset signal RST is active.

f. Invalidation Circuit

As described above, the NAND circuit 281 receives the level-inverted signal of a control signal On and the forcing shutoff signal Inhibit described below (which is low level when forcing shutoff for the power MOSFET 214 should be performed). The output signal thereof is level-inverted and inputted to the NAND circuits 280 and 282. According to this construction, the NAND circuit 281 outputs a high-level output signal, when a nonactive control signal On (OFF signal) is received. Thereby the outputs of the NAND circuits 280, 282 are maintained high level so that the OC memory 276 or the FC memory 278 would not turn to the set state, even if the current anomaly detector 253 outputs an active overcurrent signal OC or an active fuse current signal FC, or the overheat detector 225 outputs an active temperature anomaly signal OT. That is, the active overcurrent signal OC, fuse current signal FC and temperature anomaly signal OT are invalidated (or masked).

For example, in the case that the load 211 is an L-load, the source voltage of the power MOSFET 214 may be pulled to the negative side due to the surge voltage of the load 211, when the power MOSFET 214 is turned OFF in response to a nonactive control signal On (OFF signal). Therefore the second and third anomaly threshold voltages Vfc and Vop, which are generated based on the source voltage, may be also negative. Then an active fuse current signal FC or breaking indication signal OP as an anomaly signal may be outputted from the current anomaly detector 253, even if a fuse current or a wire-breaking anomaly has not occurred. However, in the present embodiment, the invalidation circuit invalidates an active fuse current signal FC when a nonactive control signal On is inputted. Thereby the fuse counter 273 is prevented from incrementing the count, and consequently a first forcing shutoff operation can be prevented.

g. Filter Circuit

A filter circuit includes a counter circuit comprising a plurality of memory circuits (e.g., two memory circuits 300, 301 (e.g., D flip-flops) in the present embodiment) serially connected to one another. The internal ground GND2 is applied to the D-terminal of the memory circuit 300, and the Q-terminal thereof is connected to the D-terminal of the next memory circuit 301. The clear signal CLR is inputted to the set terminals of both memory circuits 300, 301, and an output signal from a NOR circuit 302 is inputted to the reset terminals. The level-inverted signal of a reset signal RST from the reset signal generator 275 and the breaking indication signal OP are inputted to the NOR circuit 302.

According to this construction, while the reset signal RST is nonactive and the breaking indication signal OP is active, the filter circuit outputs a breaking anomaly signal OPF of low level (low active) from the Q terminal of the memory circuit 301 if it has received an active clear signal CLR two or more times (e.g., two times in the present embodiment). On the other hand, the filter circuit is reset when the following reset condition 9 or 10 is satisfied.

Reset Condition 9: The reset signal generator 275 outputs an active reset signal RST; and Reset Condition 10: The breaking anomaly signal OPF is nonactive (i.e., high level).

That is, the breaking anomaly signal OPF is not immediately turned to active, if the current detector 224 outputs an active breaking indication signal OP. It is turned to active, when an active clear signal CLR has been received two times from the clear counter 272 (i.e., when at least the second reference time has elapsed since the output of the active breaking indication signal OP).

The breaking anomaly signal OPF outputted from the Q-terminal of the memory circuit 301 is level-inverted, and inputted to a NAND circuit 303. A bit signal corresponding to one bit of the FR counter 271 is inputted to the NAND circuit 303, so that the NAND circuit 303 outputs a pulsed breaking anomaly signal OPFP, which is pulsed according to the inverted level of the bit signal, when the breaking anomaly signal OPF is active. In the present embodiment, the bit signal FRC7 corresponding to the most significant bit is inputted to the NAND circuit 303, and thereby the pulsed breaking anomaly signal OPFP is outputted in 32 millisecond periods with a duty ratio of 50%.

On the other hand, when the breaking anomaly signal OPFP turns to nonactive, the filter circuit immediately outputs a nonactive (high-level) breaking anomaly signal OPFP (as a normal signal) indicating a normal state. The level-inverted signal of the breaking anomaly signal OPFP and the level-inverted signal of a forcing shutoff signal Inhibit from the NOR circuit 284 are outputted as a diagnostic signal Diag via a NOR circuit 304, and provided for the diagnostic output portion 226. The diagnostic output portion 226 provides a pulsed diagnostic output on the diagnostic output terminal P7, when the breaking anomaly signal OPF is active. It provides a stepwise diagnostic output, when the forcing shutoff signal Inhibit is active. According to this construction, a wire-breaking anomaly can be distinguished from the other anomalies (i.e., an overcurrent, a fuse current and a temperature anomaly) by the diagnostic output.

As described above, in the control logic portion 227, the count of an anomaly time by the fuse anomaly protective circuit and the count of a normal duration by the normal duration accumulator circuit are performed by using the lower bits of the count value of the common free-running counter 271. Thereby, the circuit elements of the control logic circuit 227 can be reduced compared to a construction in which the fuse anomaly protective circuit and the normal duration accumulator circuit perform the count by individually using the lower bits of separate counter circuits. Further, the overcurrent protective circuit also uses the above free-running counter 271 for counting the third reference time, and thereby the circuit elements can be further reduced.

(Gate Driver)

To the gate driver 228, the control signal On, the output signal FCM and the forcing shutoff signal Inhibit are inputted from the control logic portion 227. The gate driver 228 includes a charge pump (not shown) connected between the power supply terminal P2 and the gates of the power MOSFET 214 and sense MOSFET 218, and further includes a discharge FET (not shown) connected between the gates and sources of the power MOSFET 214 and sense MOSFET 218.

When the gate driver 228 receives an active control signal On (ON signal) from the control logic portion 227, the charge pump solely operates so as to apply a higher voltage, generated from the power supply voltage Vcc, to between the gate and source of each of the power MOSFET 214 and the sense MOSFET 218. Thus, a charging operation is performed for turning ON the power MOSFET and the sense MOSFET, resulting in a conductive state. On the other hand, when the gate driver 228 receives a nonactive control signal On (OFF signal) from the control logic portion 227 or an active forcing shutoff signal Inhibit (indicating that first or second forcing shutoff should be performed), the charge pump discontinues generation of a higher voltage while the discharge FET is solely turned on, so that the charge between the gate and source of each of the power MOSFET 214 and the sense MOSFET 218 is released. Thus, a discharging operation or a shutoff operation is performed.

2. Operation According to the Present Embodiment

Figure 21:
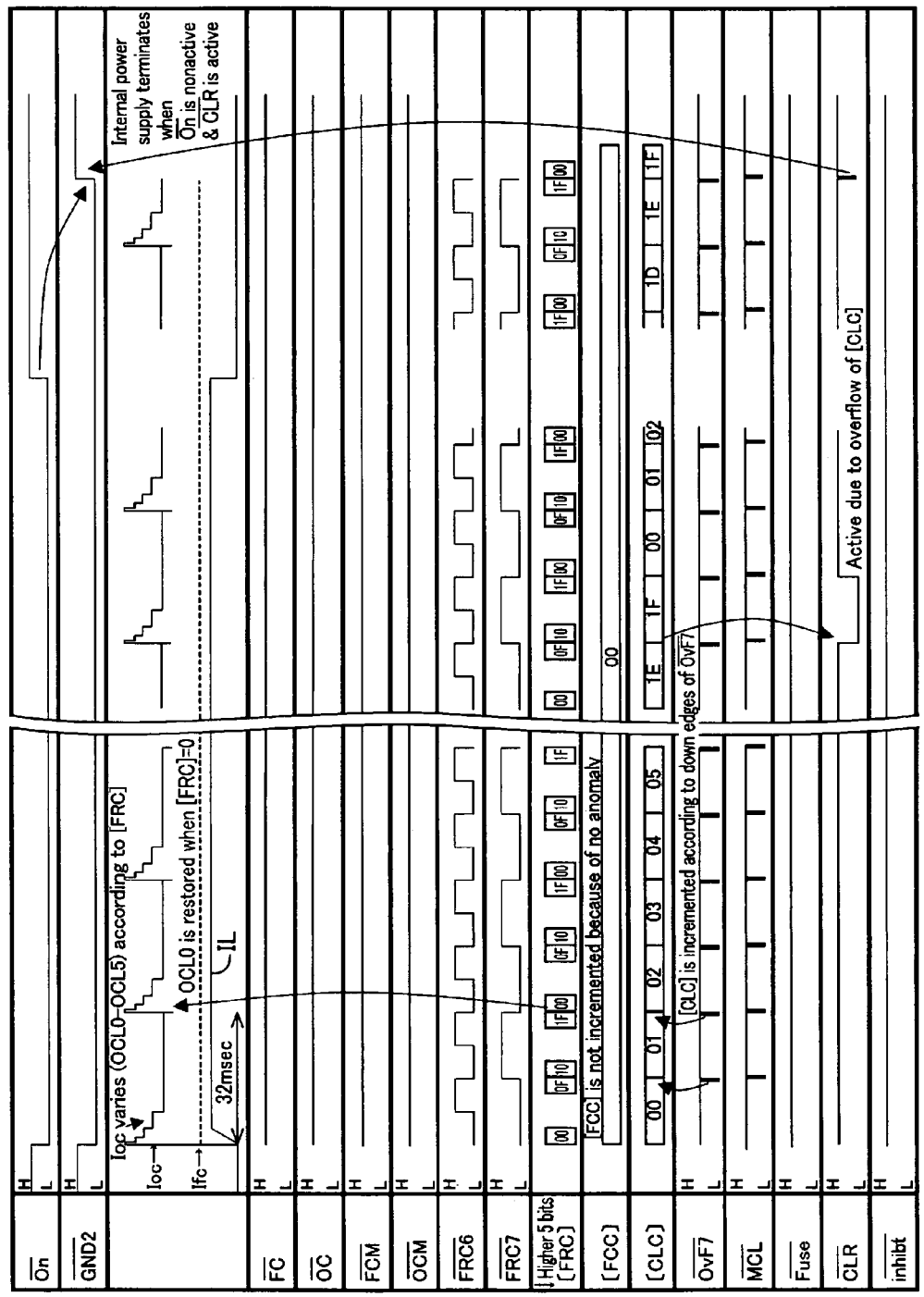
FIG. 21 is a timing chart of various signals for illustrating an operation of the power supply controller (during a normal state)
Figure 22:
FIG. 22 is a timing chart of various signals for illustrating an operation of the power supply controller (during an overcurrent)
Figure 23:
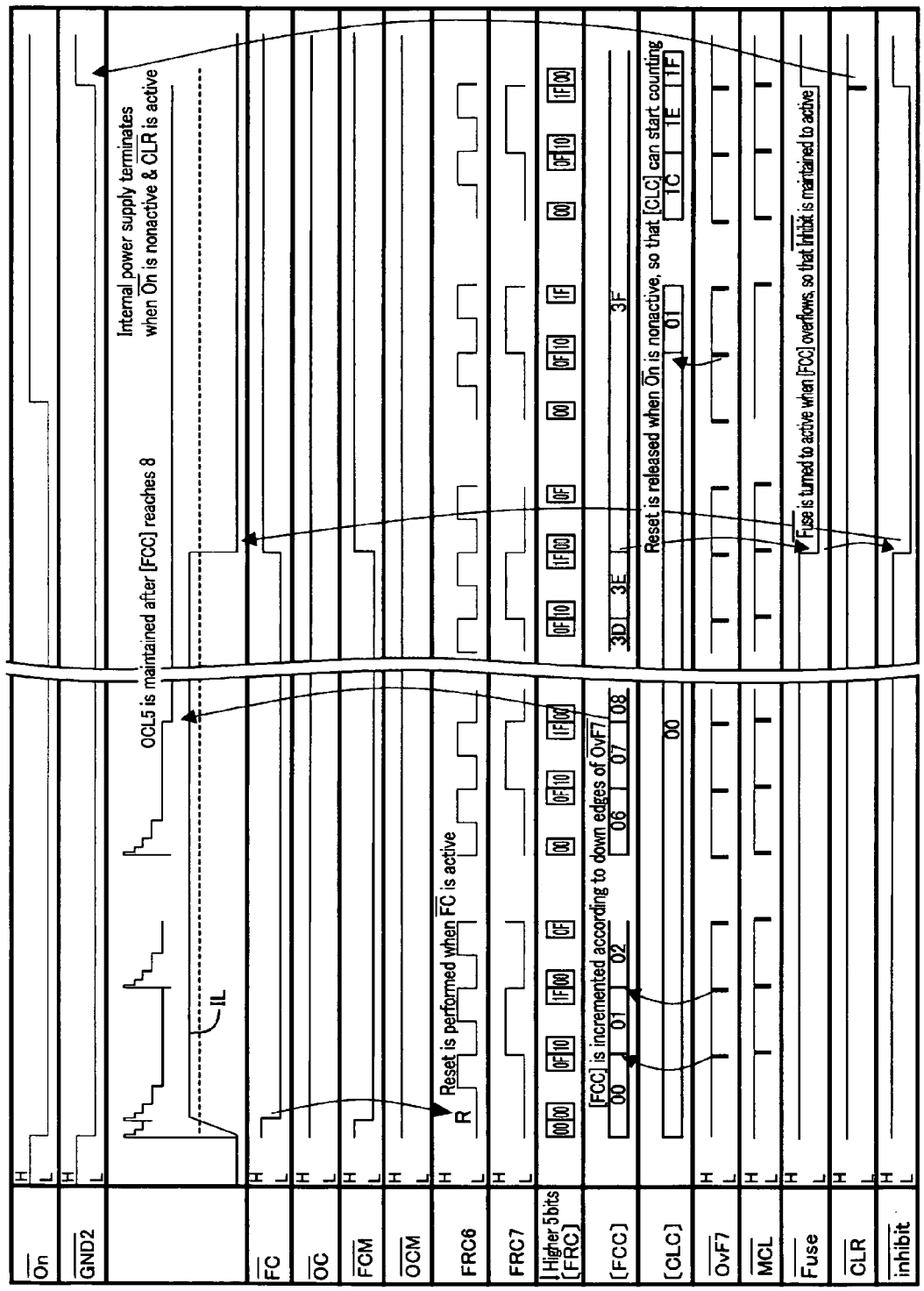
FIG. 23 is a timing chart of various signals for illustrating an operation of the power supply controller (during a fuse current).

FIGS. 21 to 23 are timing charts of various signals for illustrating the operation of the power supply controller 210. FIG. 21 relates to an operation during a normal state. FIG. 22 relates to an operation during an overcurrent occurrence. FIG. 23 relates to an operation during a fuse current occurrence. In the drawings, [FRC] represents the count value of the higher 5 bits of the FR counter 271. [FCC] represents the count value of the fuse counter 273. [CLC] represents the count value of the clear counter 272. The count values are shown in hexadecimal (e.g. A=10, B=11, C=12 and the like). Further, FRC7 represents the most significant bit of the FR counter 271, and how the most significant bit alternates between high and low levels is shown. FRC6 represents the second significant bit of the FR counter 271, and how the second significant bit alternates between high and low levels is shown. "R" in the drawings means "reset".

(Normal Operation)

When the power supply controller 210 receives an active control signal On, the internal ground generator 223 generates an internal ground GND2. When the internal ground GND2 stabilizes, the reset signal RST outputted from the reset signal generator 275 turns from active to nonactive, so that the reset states of the counters 271-273 are released.

The active control signal On is provided for the gate driver 228 via the control logic portion 227. Then the power MOSFET 214 and the like turn ON resulting in a conductive state. The FR counter 271 begins to count according to the clock signal CLK from the oscillator 274. During the normal operation, an active set signal OC1 is not outputted from the NAND circuit 280 (i.e., reset condition 2 is not satisfied), and the output signal FCM of the FC memory 278 is not level-inverted from high to low level (i.e., the reset condition 3 is not satisfied). Therefore the FR counter 271 repeatedly counts to 32 milliseconds without being reset in the middle of the count (See [FRC] in FIG. 21). At the same time, the OC threshold designation generator 293 sequentially outputs active threshold designation signals OCL0-OCL5 depending on the count value of the higher 5 bits of the FR counter 271. Thereby an operation, which decreases the first anomaly threshold current ILoc stepwise with time beginning with the initial level higher than an inrush current, is iterated in 32 millisecond periods.

When an active control signal On is inputted, an inrush current higher than the second anomaly threshold current ILfc may pass into the power MOSFET 214. However, the first anomaly threshold current ILoc is then set to the initial level higher than the inrush current, and thereby a second forcing shutoff operation due to the inrush current can be prevented from being performed for the power MOSFET 214 and the like.

During the normal operation, the anomaly notification signal Fail is nonactive, and therefore the fuse counter 273 does not start the count (See [FCC] in FIG. 21). On the other hand, the clear counter 272 increments its count value one by one at times of input of the count signal OvF7 from the FR counter 271. It is not reset in the middle of the count, since the anomaly notification signal Fail is maintained nonactive. When 512 milliseconds (i.e., the second reference time) are reached, the counter overflows and outputs an active clear signal CLR (See [CLC] and [CLR] in FIG. 21).

When the control signal On turns from active to nonactive, the internal ground generator 223 waits for overflow of the clear counter 272 as described above if the counter has not overflowed at the time. Then generation of the internal ground GND2 is terminated.

(Operation during Overcurrent or Fuse Current Occurrence)

If short-circuiting occurs in the load 211, the load current IL may exceed the second anomaly threshold current ILfc as shown in FIG. 22. At the time, the fuse current signal FC turns to active, so that the output signal FCM of the FC memory 278 is level-inverted from high to low level and the count value of the FR counter 271 is reset. Thereby the first anomaly threshold current ILoc is restored to the initial level, and thereafter is decreased stepwise again with time according to the count value of the FR counter 271 that starts the count after the reset.

When the load current IL thereafter exceeds the first anomaly threshold current ILoc, the overcurrent signal OC turns to active and the set signal OC1 from the NAND circuit 280 turns to active. Thereby the second forcing shutoff signal OCM from the OC memory 276 turns to active. Then a second forcing shutoff operation of the power MOSFET 214 is performed in response to an active forcing shutoff signal Inhibit. Further the count value of the FR counter 271 is reset in response to the active set signal OC1. Thereafter an active count signal OvF7 is outputted when a time slightly shorter than 16 milliseconds has elapsed. In response to this, the fuse counter 273 increments its count value by one (See [FCC] in FIG. 22). An active shutoff release signal MCL is outputted when the FR counter 271 has counted 16 milliseconds. Then the OC memory 276 outputs a nonactive second forcing shutoff signal OCM so that the power MOSFET 214 is returned to ON and the forcing shutoff state is released.

If the short-circuiting in the load 211 is thereafter not eliminated, the clear counter 272 will not start the count, and the second forcing shutoff is performed repeatedly. During that time, the fuse counter 273 increments its count value one by one. If the count value [FCC] reaches seven (i.e., if the second forcing shutoff has been performed seven times), the OC threshold designation generator 293 thereafter keeps outputting an active threshold designation signal OCL5 so that the first anomaly threshold current ILoc is maintained to the lowest level.

When the fuse counter 273 has overflowed, it outputs an active first forcing shutoff signal Fuse so that the forcing shutoff operation for the power MOSFET 214 is performed. At this time, the count operation according to the count signal OvF7 is discontinued, so that the forcing shutoff state (due to the first forcing shutoff) is maintained. Note that the second anomaly threshold current ILfc is set to a level slightly higher than the rated current ILmax of the load 211. The reference FUSE time is set to a time shorter than the time taken for the electric wire 230 to emit smoke when a fuse current, i.e., a current higher than the second anomaly threshold current ILfc, is intermittently detected at intervals shorter than the second reference time. Therefore, a chattering short, i.e., an abnormal current that occurs in a fraction of the stranded wires of the electric wire 230 at intervals shorter than the second reference time due to short-circuiting in the fraction of the stranded wires, can be detected without the electric wire 230 reaching smoke emission, so that the second forcing shutoff can be performed for the power MOSFET 214.

Thereafter, if the control signal On turns from active to nonactive as shown in FIG. 23, the reset state of the clear counter 272 is released. The clear counter continues to output a nonactive clear signal CLR until its overflow, so that generation of the internal ground GND2 is maintained. When the clear counter has overflowed, generation of the internal ground GND2 is terminated. Therefore, the first forcing shutoff state is maintained, even if the control signal On returns to active before the clear counter 272 overflows.

(Operation during Wire-Breaking Anomaly Occurrence)

If the third anomaly threshold current ILop is supposedly set to a fixed value, a load resistance value (i.e., a resistance value of the external circuit), based on which an active breaking indication signal OP is outputted, varies with variation of the power supply voltage Vcc. However, a wire-breaking anomaly should be determined consistently based on the same load resistance value regardless of variation of the power supply voltage Vcc, in order to accurately detect the wire-breaking anomaly.

Therefore, in the present embodiment, the third anomaly threshold current ILop (and the third anomaly threshold voltage Vop) are set so as to vary in proportion to the source voltage Vs of (or the power supply voltage Vcc for) the power MOSFET 214 in the ON state as described above. According to this construction, the third anomaly threshold current ILop decreases by half, if the power supply voltage Vcc decreases by half, for example. That is, the load resistance value, based on which a wire-breaking anomaly is detected (and which is equal to a value determined by dividing the power supply voltage Vcc by the third anomaly threshold current ILop), is the same regardless of variation of the power supply voltage Vcc. Thereby, a wire-breaking anomaly can be detected accurately. Further, a microcomputer or the like is not required.

Other Embodiments

The present invention is not limited to the embodiments explained in the above description made with reference to the drawings. The following embodiments may be included in the technical scope of the present invention, for example, and further the present invention may be embodied in various forms without departing from the scope of the invention.

(1) Each of the above shutoff duration counter 70, the fuse time counter 71 and the clear counter 72 is formed as a counter circuit that digitally accumulates a time, but not limited to this construction. For example, a capacitor may be used so that a time is analogically accumulated.

(2) In the construction shown in FIG. 10 of the third embodiment, whether the latch function of the latch circuit 101 is validated or invalidated may be determined based on the potential level that changes depending on what a switching pad 117 is connected to, as shown in FIG. 14.

(3) In the construction shown in FIG. 13 of the fourth embodiment, whether the latch function of the latch circuit 101 is validated or invalidated and the like may be determined based on the input level of a control signal S1 as shown in FIGS. 11 and 12.

(4) In the above embodiments, the normal duration accumulator circuit, the anomaly time accumulator circuit and the shutoff duration accumulator circuit are formed as counter circuits, but not limited to this construction. For example, each may be formed as a timer circuit that includes a constant current circuit, a capacitor into which a constant current from the constant current circuit passes, and a discharge circuit for discharging the capacitor.

The invention claimed is:

1. A power supply controller for controlling power supply from a power source to a load, comprising:
   a semiconductor switching element disposed on a power supply line from said power source to said load;
   a current detecting element configured to detect a load current passing through said semiconductor switching element;

a first abnormal current detecting circuit configured to determine, based on a detection signal from said current detecting element, whether a load current passing through said semiconductor switching element exceeds a first threshold, and further configured to output a first abnormal current signal if said load current exceeds said first threshold;

an anomaly time accumulator circuit configured to start accumulation of an anomaly time if said first abnormal current detecting circuit outputs said first abnormal current signal, and further configured to initiate a first shutoff operation for said semiconductor switching element when said anomaly time reaches a first reference time;

a normal duration accumulator circuit configured to output a clear signal when a normal duration, during which said load current is continuously maintained lower than said first threshold, reaches a second reference time after said anomaly time accumulator circuit starts the accumulation; and an anomaly time clear circuit configured to clear said anomaly time of said anomaly time accumulator circuit based on an output of said clear signal.

2. A power supply controller as in claim 1, further comprising:

a second abnormal current detecting circuit configured to determine, based on a detection signal from said current detecting element, whether a load current passing through said semiconductor switching element exceeds a second threshold higher than the first threshold, and further configured to output a second abnormal current signal if said load current exceeds said second threshold; and a shutoff duration accumulator circuit configured to initiate a second shutoff operation for said semiconductor switching element if said second abnormal current detecting circuit outputs said second abnormal current signal, and further configured to release a state of said semiconductor switching element under said second shutoff when a third reference time shorter than said second reference time has elapsed since the initiation;

wherein, while the state of said semiconductor switching element under said second shutoff due to said shutoff duration accumulator circuit continues, said normal duration accumulator circuit maintains said normal duration to a reset state, and said anomaly time accumulator circuit progresses the accumulation of said anomaly time.

3. A power supply controller as in claim 1, further comprising:

a free-running counter circuit configured to repeat count of a predetermined time and output a count-up signal whenever each count of said predetermined time is completed, wherein:

said anomaly time accumulator circuit includes a fuse counter circuit configured to increment its count whenever said free-running counter circuit outputs said count-up signal if said first abnormal current detecting circuit outputs said first abnormal current signal, and further configured to initiate said first shutoff operation for said semiconductor switching element when its count value reaches a reference anomaly count value; and said normal duration accumulator circuit includes a clear counter circuit configured to increment its count whenever said free-running counter circuit outputs said count-up signal, and further configured to output said clear signal when its count value reaches a reference clear count value, and further includes a normal duration reset circuit configured to reset a count value of said clear counter circuit based on an output of said first abnormal current signal from said first abnormal current detecting circuit.

4. A power supply controller as in claim 3, further comprising:

a second abnormal current detecting circuit configured to determine, based on a detection signal from said current detecting element, whether a load current passing through said semiconductor switching element exceeds a second threshold higher than the first threshold, and further configured to output a second abnormal current signal if said load current exceeds said second threshold; and a shutoff circuit configured to initiate a second shutoff operation for said semiconductor switching element if said second abnormal current detecting circuit outputs said second abnormal current signal, and further configured to release a state of said semiconductor switching element under said second shutoff based on a third reference time, shorter than said second reference time, having been counted by said free-running counter circuit.

5. A power supply controller as in claim 4, wherein, while the state of said semiconductor switching element under said second shutoff continues, said normal duration reset circuit maintains the count value of said clear counter circuit to a reset state, and said fuse counter circuit progresses count according to said count-up signal.

6. A power supply controller as in claim 1, wherein said semiconductor switching element is a power FET; said current detecting element is a sense FET through which a sense current having a predetermined relation to a load current passing through said power FET passes; and said sense current is outputted as said detection signal.

7. A power supply controller as in claim 1, wherein:

said semiconductor switching element is a power FET; and a discharge rate changing circuit is provided for releasing a gate charge of said power FET, during said shutoff operation being performed for said power FET based on said abnormal current signal, at a discharge rate higher than that when a shutoff operation is performed during a normal state in which said abnormal current signal is not outputted.

8. A power supply controller as in claim 1, wherein:

said semiconductor switching element is a power FET; and a charge rate changing circuit is provided for supplying a gate charge of said power FET, during an output of said abnormal current signal, at a charge rate higher than that when a conductive operation is performed during a normal state in which said abnormal current signal is not outputted.

9. A power supply controller as in claim 1, further comprising a latch circuit configured to maintain a shutoff state of said semiconductor switching element caused by said anomaly time accumulator circuit.

10. A power supply controller as in claim 9, wherein said latch circuit is configured to maintain the shutoff state of said semiconductor switching element by stopping the accumulating operation of said normal duration accumulator circuit, if the anomaly time of said anomaly time accumulator circuit reaches said first reference time.

11. A power supply controller as in claim 9, wherein said latch circuit is configured to maintain the shutoff state of said semiconductor switching element by invalidating the clear signal from said normal duration accumulator circuit so that the clear signal is not received, if the anomaly time of said anomaly time accumulator circuit reaches said first reference time.

12. A power supply controller as in claim 9, wherein:
at least said normal duration accumulator circuit and said anomaly time accumulator circuit are configured onto a single chip or a plurality of chips housed in a package so as to form a semiconductor device; and
said semiconductor device includes an external input terminal, and whether maintenance of the shutoff state of said semiconductor switching element is provided or not is selected depending on an input level at said external input terminal.

13. A power supply controller as in claim 12, wherein a control signal, for requesting a conductive operation for said semiconductor switching element during a normal state in which said abnormal current signal is not outputted, is inputted to said external input terminal.

14. A power supply controller as in claim 9, wherein:
at least said normal duration accumulator circuit and said anomaly time accumulator circuit are configured onto a single chip or a plurality of chips housed in a package so as to form a semiconductor device; and
whether maintenance of the shutoff state of said semiconductor switching element is provided or not is selected depending on an input level at a bonding pad on a semiconductor chip of said semiconductor device, said input level varying according to what said bonding pad is connected to via a wire bonding.

15. A power supply controller as in claim 1, further comprising a release circuit configured to release the shutoff state of said semiconductor switching element caused by said anomaly time accumulator circuit, when a holding time expires.

16. A power supply controller as in claim 15, wherein said release circuit releases said shutoff state by clearing said anomaly time in response to a clear signal outputted from said normal duration accumulator circuit after a shutoff operation for said semiconductor switching element is initiated due to said anomaly time accumulator circuit.

17. A power supply controller as in claim 15, wherein a time, until a shutoff operation for said semiconductor switching element is initiated due to said anomaly time accumulator circuit as the second time or more shutoff operation, is set to be shorter than that for a previous time.

18. A power supply controller as in claim 17, wherein:
said release circuit is configured to release said shutoff state by clearing said anomaly time in response to a clear signal outputted from said normal duration accumulator circuit after a shutoff operation for said semiconductor switching element is initiated due to said anomaly time accumulator circuit; and
the anomaly time of said anomaly time accumulator circuit is partially cleared in response to the clear signal outputted after the shutoff operation for said semiconductor switching element is initiated, when the shutoff operation for said semiconductor switching element is performed for a second time or more.

19. A power supply controller as in claim 18, wherein:
at least said normal duration accumulator circuit and said anomaly time accumulator circuit are configured onto a single chip or a plurality of chips housed in a package so as to form a semiconductor device; and
said semiconductor device includes an external input terminal, and whether the anomaly time of said anomaly time accumulator circuit is cleared partially or completely, when said shutoff operation is performed for a second time or more, is selected depending on an input level at said external input terminal.

20. A power supply controller as in claim 19, wherein a control signal, for requesting a conductive operation for said semiconductor switching element, during a normal state in which said abnormal current signal is not outputted, is inputted to said external input terminal.

21. A power supply controller as in claim 18, wherein:
at least said normal duration accumulator circuit and said anomaly time accumulator circuit are configured onto a single chip or a plurality of chips housed in a package so as to form a semiconductor device; and
whether the anomaly time of said anomaly time accumulator circuit is cleared partially or completely, when said shutoff operation is performed for a second time or more, is selected depending on an input level at a bonding pad on a semiconductor chip of said semiconductor device, said input level varying according to what said bonding pad is connected to via a wire bonding.

* * * * *

UNITED STATES PATENT AND TRADEMARK OFFICE
CERTIFICATE OF CORRECTION

| | | |
|---|---|---|
| PATENT NO. | : 7,813,096 B2 | |
| APPLICATION NO. | : 12/086640 | |
| DATED | : October 12, 2010 | |
| INVENTOR(S) | : Seiji Takahashi et al. | |

It is certified that error appears in the above-identified patent and that said Letters Patent is hereby corrected as shown below:

On the Title Page, insert item:

--(30)  Foreign Application Priority Data

Dec. 26, 2005   (JP)   373081/2005
Jul. 1, 2006    (JP)   190711/2006--

Signed and Sealed this
Twenty-eighth Day of December, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,813,096 B2 | Page 1 of 1 |
| APPLICATION NO. | : 12/086640 | |
| DATED | : October 12, 2010 | |
| INVENTOR(S) | : Seiji Takahashi et al. | |

It is certified that error appears in the above-identified patent and that said Letters Patent is hereby corrected as shown below:

On the title page:

Please delete the following:

"(30)   Foreign Application Priority Data
        Dec. 26 2005   (JP)   373081/2005
        Jul. 1, 2006   (JP)   190711/2006"

And Replace with:

(30)    Foreign Application Priority Data
        Dec. 26, 2005  (JP)   373081/2005
        Jul. 11, 2006  (JP)   190711/2006

Signed and Sealed this
Twenty-fourth Day of May, 2011

David J. Kappos
*Director of the United States Patent and Trademark Office*